(12) United States Patent
Komoto

(10) Patent No.: US 9,281,585 B2
(45) Date of Patent: Mar. 8, 2016

(54) CONNECTOR

(71) Applicant: JAPAN AVIATION ELECTRONICS INDUSTRY, LIMITED, Shibuyaku, Tokyo (JP)

(72) Inventor: Tetsuya Komoto, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 14/679,973

(22) Filed: Apr. 6, 2015

(65) Prior Publication Data

US 2015/0349445 A1 Dec. 3, 2015

(30) Foreign Application Priority Data

May 30, 2014 (JP) .................................. 2014-112390

(51) Int. Cl.
*H01R 13/62* (2006.01)
*H01R 12/71* (2011.01)
*H01R 13/629* (2006.01)

(52) U.S. Cl.
CPC ............ *H01R 12/714* (2013.01); *H01R 13/629* (2013.01)

(58) Field of Classification Search
CPC .... H01R 13/193; H01R 12/716; H01R 12/89; H01R 13/506; H01R 13/516
USPC ........................................... 439/370, 342, 71
See application file for complete search history.

(56) References Cited

U.S. PATENT DOCUMENTS

| 7,241,160 | B2* | 7/2007 | Yang ................... H01R 13/2442 439/330 |
| 7,402,079 | B2* | 7/2008 | Yang ................ H01R 13/65802 439/607.02 |
| 7,537,462 | B2* | 5/2009 | Higuchi ............... G01R 1/0735 439/71 |
| 8,801,439 | B2* | 8/2014 | Sato ....................... H01R 13/22 439/342 |
| 8,821,178 | B2* | 9/2014 | Fukui ....................... H01R 4/48 439/342 |
| 9,106,006 | B2* | 8/2015 | Fukui ....................... H01R 4/04 |

FOREIGN PATENT DOCUMENTS

JP 2012226973 A 11/2012

* cited by examiner

*Primary Examiner* — Xuong Chung Trans
(74) *Attorney, Agent, or Firm* — Holtz, Holtz & Volek PC

(57) ABSTRACT

A connector reduced in inspection cost by making it possible to visually check a state of connection between contact portions of contacts and terminal portions of an object to be connected. A male-side holding member includes a plurality of belt-like holding portions that hold linking portions of a plurality of male-side contacts, a holding member-side linking portion that links the plurality of holding portions arranged in parallel to each other, and a plurality of visually checking portions for visually checking a state of connection between contact portions of the male-side contacts and terminal portions of an electronic component from the other surface side of the male-side holding member. The visually checking portions are adjacent to the holding portions.

20 Claims, 23 Drawing Sheets ized electronic device, such as a
CONNECTOR

BACKGROUND OF THE INVENTION

1. Field of the Invention

This invention relates to a connector.

2. Description of the Related Art

Conventionally, as shown in FIG. 22, there has been proposed a male connector 901 including a housing 911 having a flat plate shape, a plurality of contact pads 951 provided on one surface of the housing 911, a protruding terminal 953 protruding from a surface of each contact pad 951, a plurality of connection pads (not shown) provided on the other surface of the housing 911, and a conductor trace (not shown) that electrically connects each connection pad and each contact pad 951 (see Japanese Laid-Open Patent Publication (Kokai) No. 2012-226973). As shown in FIG. 23, the male connector 901 and a female connector 9101 form a module socket. The module socket is used so as to mount a module 991, such as a camera module, on a small-sized electronic device, such as a cellular phone.

The housing 911 has a substantially rectangular shape, and has four corners each formed with a cutout 913. A lower surface of the module 991 has protruding legs 993 formed at four corners thereof, which can be fitted in the cutouts 913 of the housing 911, respectively.

When the male connector 901 is mounted on the lower surface of the module 991, the protruding legs 993 of the module 991 and the cutouts 913 of the housing 911 are fitted to each other, respectively. As a result, the male connector 901 is positioned with respect to the module 991. The connection pads of the male connector 901 are soldered to connection pads (not shown) formed on the lower surface of the module 991, respectively. Thus, the male connector 901 is mechanically and electrically connected to the module 991.

After the male connector 901 has been connected to the module 991, it is impossible to visually check the state of connection between the connection pads of the male connector 901 and the connection pads of the module 991, from the outside.

Therefore, to determine whether or not the connection pads of the male connector 901 and the connection pads of the module 991 are properly connected to each other, it is necessary to use e.g. an expensive X-ray nondestructive inspection system, which is one of factors increasing the inspection cost of the male connector 901.

SUMMARY OF THE INVENTION

The present invention has been made in view of these circumstances, and an object thereof is to provide a connector reduced in inspection cost by making it possible to visually check the state of connection between connection portions of contacts of the connector and terminal portions of an object to be connected.

To attain the above object, the present invention provides a connector that is connected to a mating connector, including a plurality of contacts, and a holding member that has a flat plate shape and holds the plurality of contacts, wherein each contact comprises a connection portion that is disposed on one surface side of the holding member and is connected to an object to be connected, a contact portion that is disposed on the other surface side of the holding member and is brought into contact with a mating contact portion of the mating connector, and a linking portion that links between the connection portion and the contact portion, and wherein the holding member comprises a plurality of holding portions that each have a belt-like shape and hold a plurality of the linking portions, a holding member-side linking portion that links the plurality of holding portions that are arranged in parallel to each other, and a plurality of visually checking portions for visually checking a state of connection between the connection portions and terminal portions of the object to be connected, from the other surface side of the holding member, and wherein the visually checking portions are adjacent to the holding portions.

Preferably, the connection portions are arranged in a manner corresponding to a grid array of the terminal portions of the object to be connected, and the connection portions are continuous with the linking portions in a direction of a thickness of the holding member.

Preferably, the holding member-side linking portion includes a frame portion that supports opposite ends of the plurality of holding portions, and a plurality of belt-like portions that are arranged in a manner bridging the frame portion such that the belt-like portions each intersect with the plurality of holding portions, and the visually checking portions are holes.

More preferably, the holding member has elasticity, and at least one of each holding portion and each belt-like portion has a wavy shape.

More preferably, the holding member has elasticity, and at least one of each holding portion and each belt-like portion has a straight shape.

Further preferably, a pair of flexibility-increasing holes are formed in the holding portion in a manner adjacent to opposite sides of the linking portion.

Preferably, the connection portion has a flat plate shape.

Preferably, the contact portion protrudes from the other surface of the holding member perpendicularly thereto and has a shape that is inserted into the mating contact portion.

Preferably, the connector further comprises a reinforcing member that is fixed to a peripheral portion of at least one surface of the holding member.

Preferably, the object to be connected is an electronic component.

Preferably, the object to be connected is a printed circuit board.

According to the present invention, it is possible to visually check the state of connection between the connection portions of the contacts and the terminal portions of the object to be connected, and thereby reduce the inspection cost of the connector.

The above and other objects, features and advantages of the present invention will become more apparent from the following detailed description taken in conjunction with the accompanying drawings.

DETAILED DESCRIPTION OF THE PREFERRED EMBODIMENTS

Figure 1:
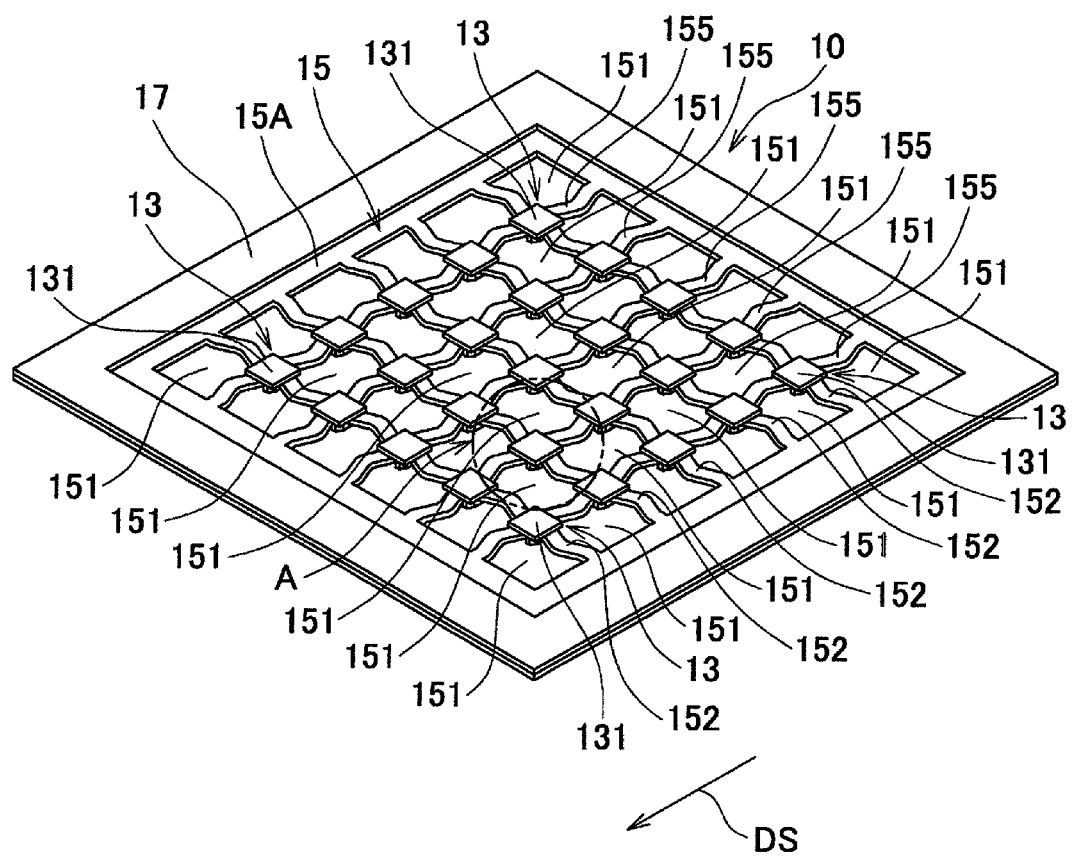
FIG. 1 is a perspective view of a male-side connector according to a first embodiment of the present invention.
Figure 2:
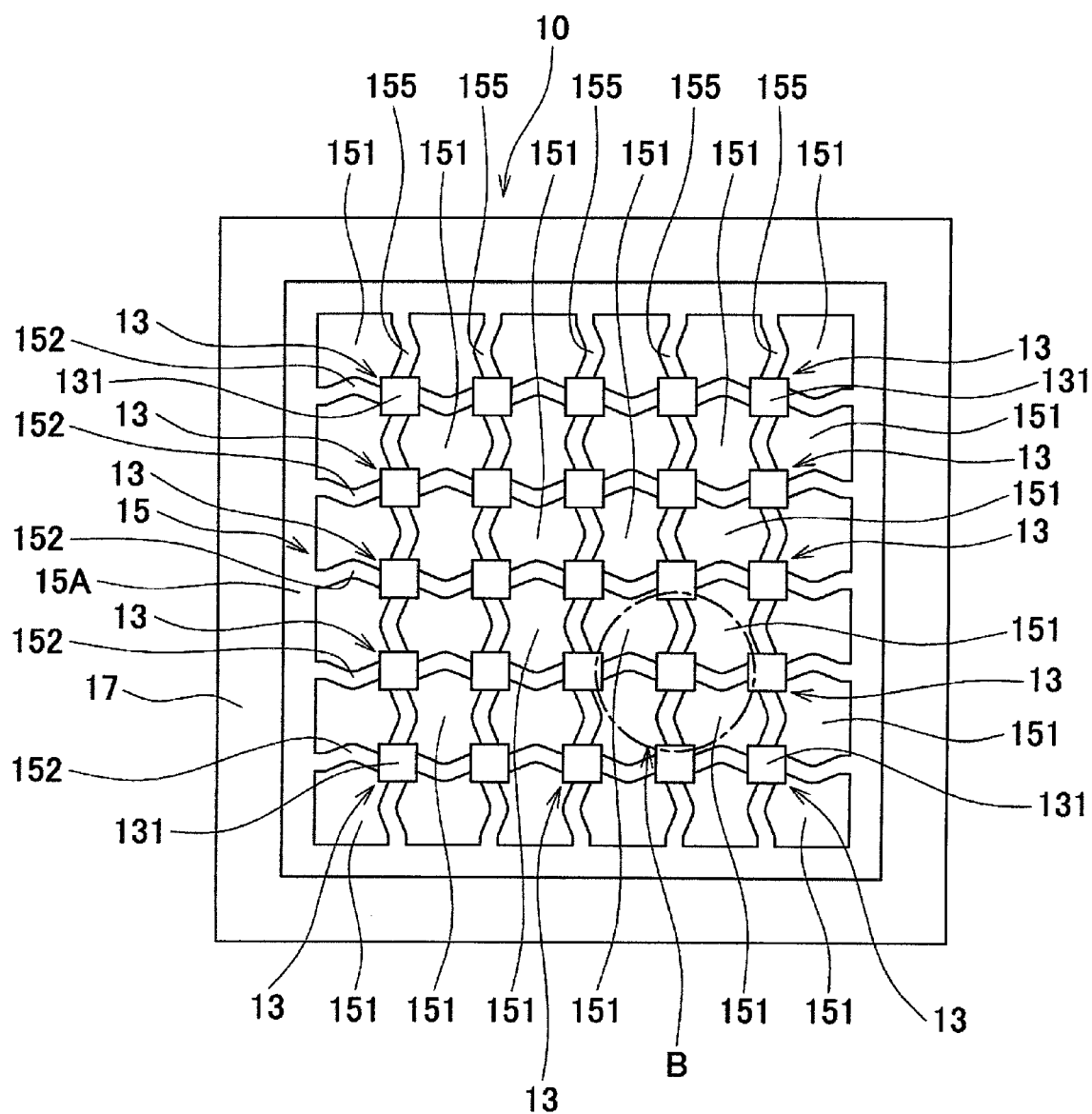
FIG. 2 is a plan view of the male-side connector shown in FIG. 1.

The present invention will now be described in detail with reference to the drawings showing preferred embodiments thereof.

First, a description will be given of a male-side connector (connector) 10 according to a first embodiment of the present invention. As shown in FIGS. 1 to 5, the male-side connector 10 is comprised of a plurality of male-side contacts (contacts) 13, a male-side holding member (holding member) 15 that has a flat plate shape and holds the plurality of male-side contacts 13, and a reinforcing frame (reinforcing member) 17 that is fixed to a peripheral portion of one surface 15A of the male-side holding member 15. The male-side connector 10 is used as a connector for an electronic component (object to be connected), such as a camera module, not shown, and is fitted in and connected to a female-side connector 30 (see FIG. 10), described hereinafter, which is mounted on a printed circuit board, not shown. By fitting the male-side connector 10 and the female-side connector 30 to each other, the electronic component and the printed circuit board are electrically connected.

As shown in FIGS. 6 to 9, each male-side contact 13 includes a connection portion 131, a contact portion 132, and a linking portion 133 (portion which is held by an associated one of a plurality of holding portions 152, described hereinafter, and is hidden by the same and hence invisible from the outside). The male-side contact 13 is formed of a conductive material, such as bronze alloy.

The connection portion 131 is disposed on one surface 15A side of the male-side holding member 15 (see FIG. 1), and is connected to one of terminal portions arranged in a grid (not shown, e.g. a ball grid array) of the electronic component. The connection portion 131 has a flat plate shape, and is square in plan view. The connection portion 131 is continuous with the linking portion 133 in a direction of the thickness of the male-side holding member 15.

Figure 3:
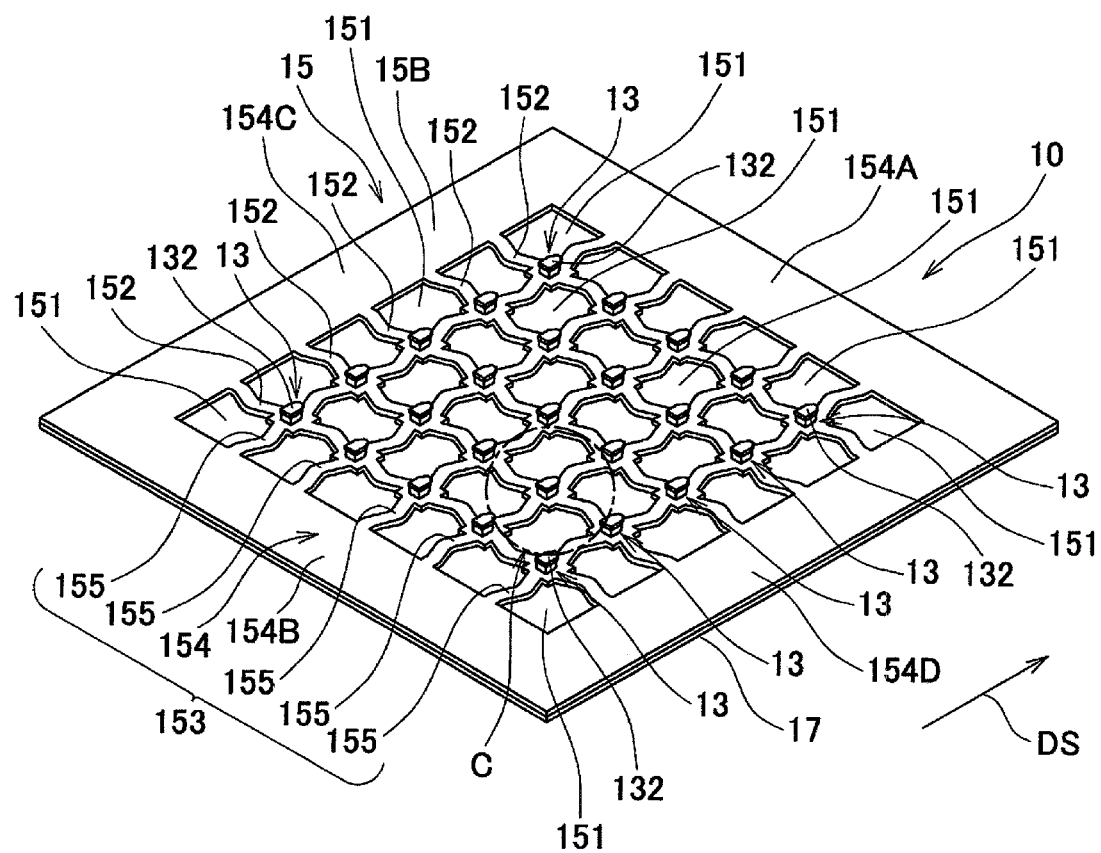
FIG. 3 is a perspective view of the male-side connector shown in FIG. 1, in which the male-side connector is inverted upside down.

The contact portion 132 is disposed on the other surface 15B side of the male-side holding member 15 (see FIG. 3). The contact portion 132 protrudes from the other surface 15B of the male-side holding member 15 perpendicularly thereto, and can be brought into contact with a contact portion 332 (see FIG. 11) of an associated one of female-side contacts 33 of the female-side connector 30. The contact portion 132 includes a contact portion body 132A and a retaining portion 132B. The contact portion body 132A has a front end portion which is narrowed in a direction DS in which the male-side connector 10 is slid relative to the female-side connector 30 (see FIG. 8). The retaining portion 132B has a flat plate shape, and has the same shape in plan view as the cross-sectional shape of the contact portion body 132A. An area of the flat surface of the retaining portion 132B (one end face of the retaining portion 132B in the direction of the thickness of the male-side holding member 15) is larger than an area of the cross-section of the contact portion body 132A. The contact portion 332 of the female-side connector 30 is sandwiched between the retaining portion 132B and the other surface 15B of the male-side holding member 15. As a result, when the male-side connector 10 and the female-side connector 30 are in a state fitted to each other, the contact portions 132 are difficult to be removed from the associated contact portions 332 of the female-side connector 30.

The linking portion 133 links the connection portion 131 and the contact portion 132. The linking portion 133 is fitted in a holding hole 152A associated therewith (see FIG. 5) which is formed in each holding portion 152 of the male-side holding member 15, and is held by the male-side holding member 15. The linking portion 133 has the same cross-sectional shape as that of the contact portion body 132A, and the cross-section of the linking portion 133 has the same size as the cross-section of the contact portion body 132A.

The male-side holding member 15 is formed by an insulating film made of e.g. polyimide, and has elasticity. The male-side holding member 15 has a plurality of holes (visually checking portions) 151, the plurality of holding portions 152, and a holding member-side linking portion 153 (see FIG. 5).

Each hole 151 is a hole for visually checking the state of connection between each connection portion 131 and an associated one of the terminal portions of the electronic component from the other surface 15B side of the male-side holding member 15 after the male-side connector 10 has been mounted on the electronic component. The holes 151 are all adjacent to the holding portions 152.

The plurality of holding portions 152 each have a belt-like shape, and extend in a wavy shape in the same direction (direction parallel to the longitudinal direction of a first plate-like portion 154A and a second plate-like portion 154B, described hereinafter) (see FIG. 5). The holding portions 152 hold the linking portions 133 of the plurality of male-side contacts 13. Each holding portion 152 is formed with a plurality of holding holes 152A at equally-spaced intervals. Each holding hole 152A receives therethrough the linking portion 133 of an associated one of the male-side contacts 13. The plurality of male-side contacts 13 held by the holding portions 152 are arranged in a grid.

The holding member-side linking portion 153 is formed by a frame portion 154 and a plurality of belt-like portions 155.

Figure 4:
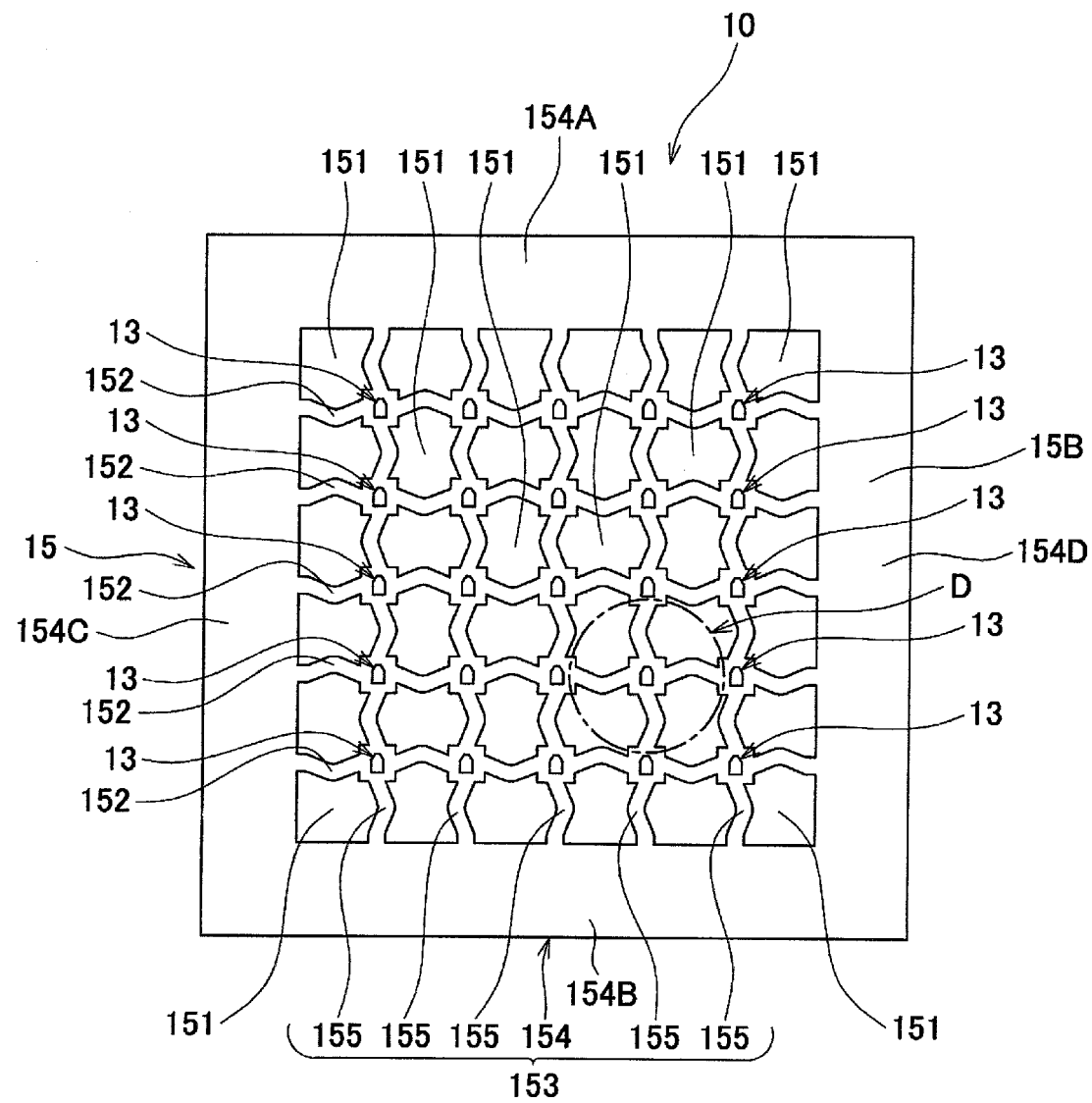
FIG. 4 is a bottom view of the male-side connector shown in FIG. 1.
Figure 5:
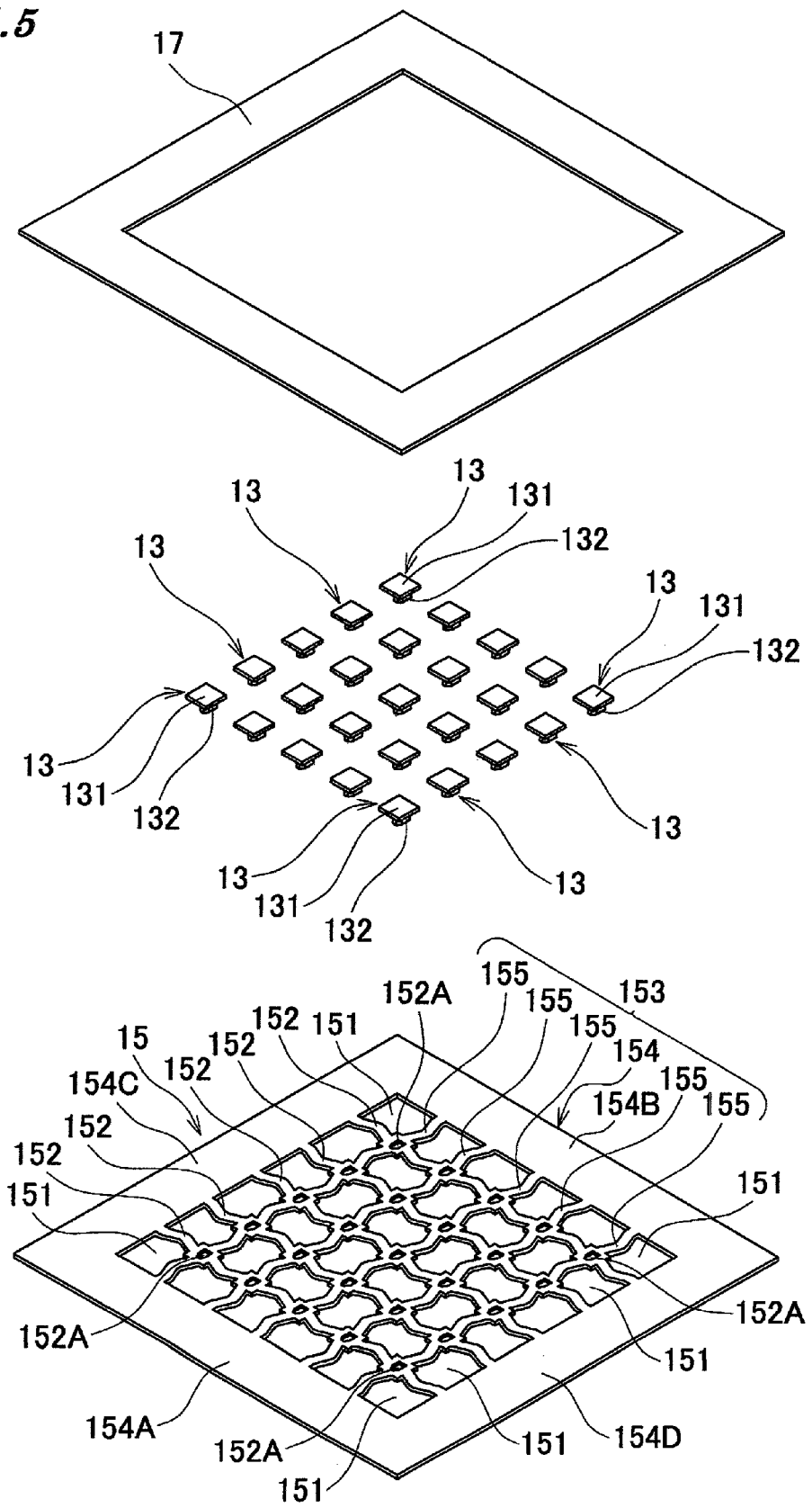
FIG. 5 is an exploded perspective view of the male-side connector shown in FIG. 1, in which the male-side connector is separated into an insulating member and conductive members.
Figure 6:
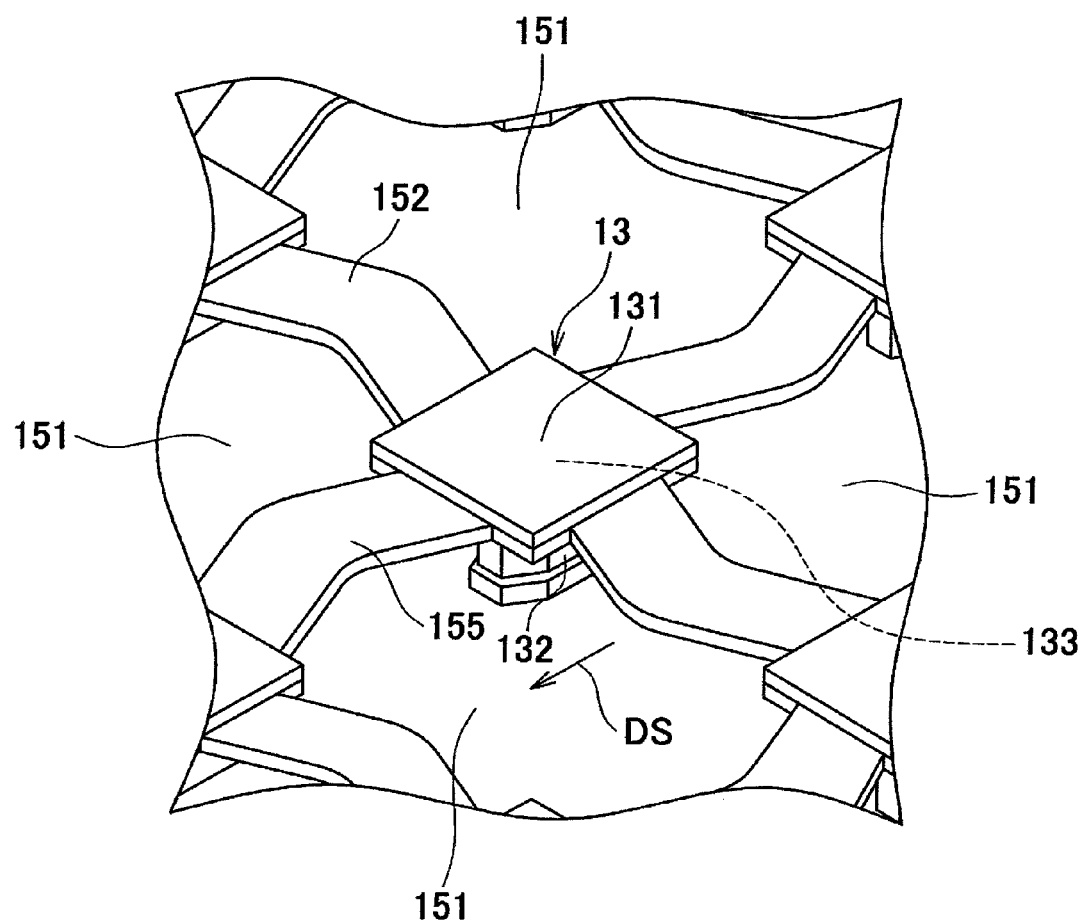
FIG. 6 is an enlarged view of part A in FIG. 1.
Figure 7:
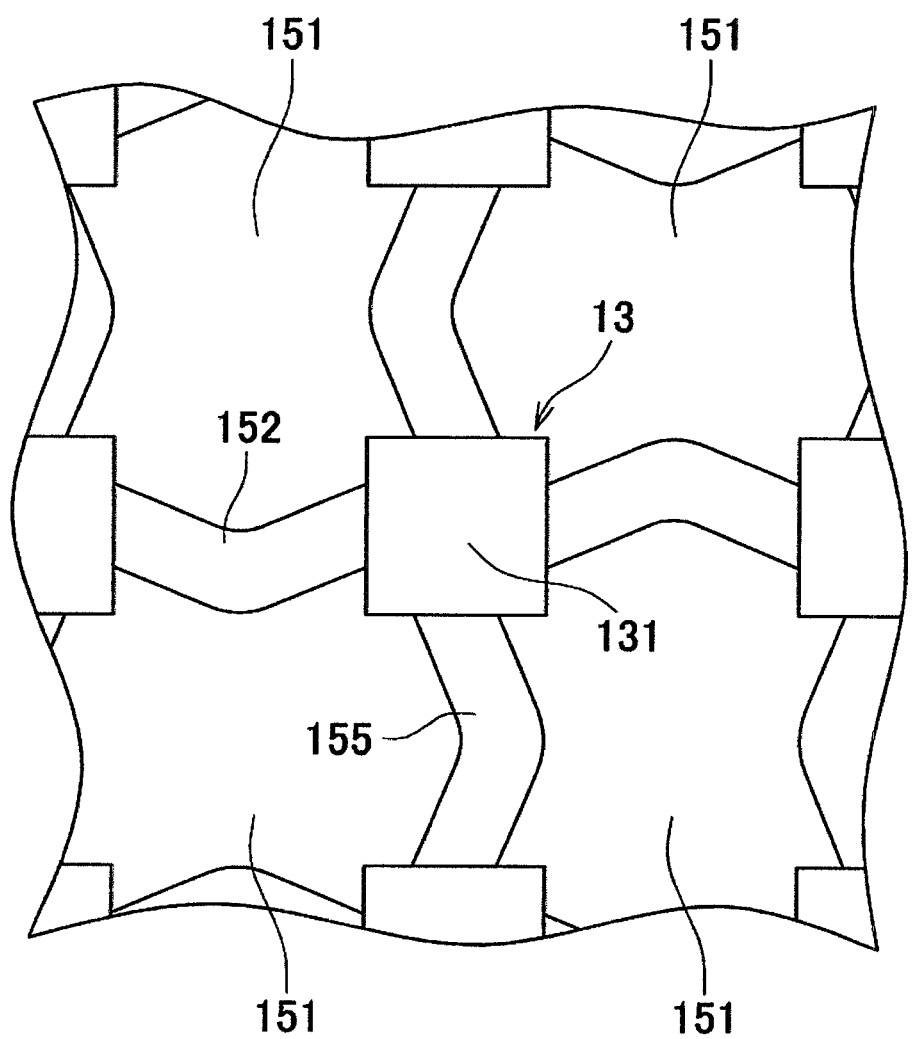
FIG. 7 is an enlarged view of part B in FIG. 2.
Figure 8:
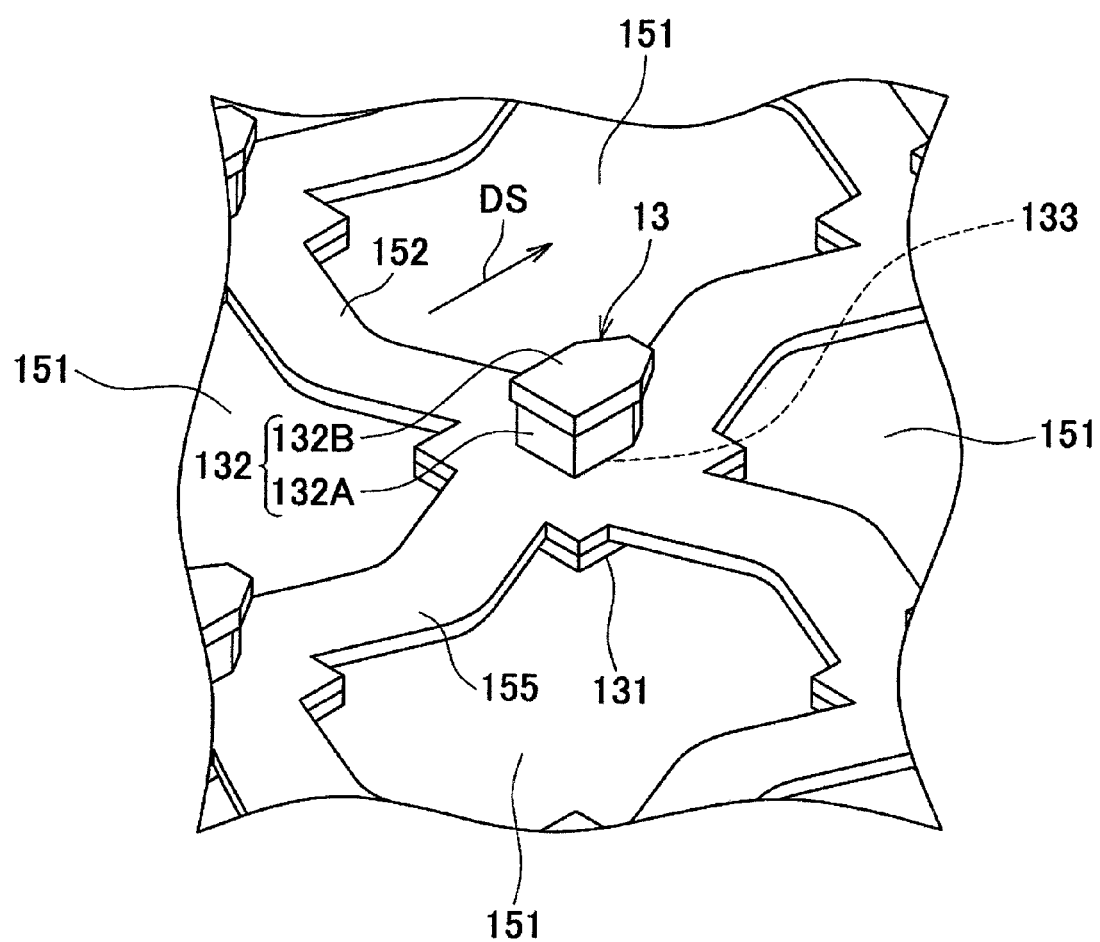
FIG. 8 is an enlarged view of part C in FIG. 3.
Figure 9:
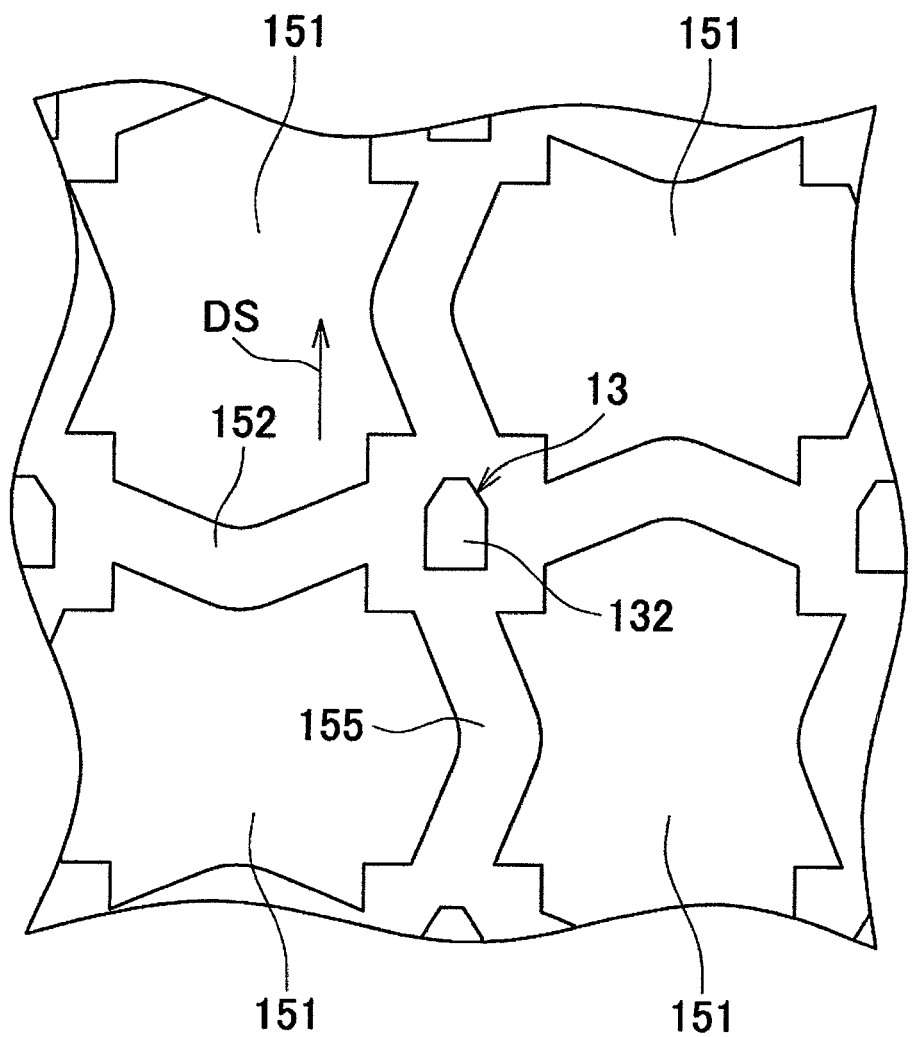
FIG. 9 is an enlarged view of part D in FIG. 4.

The frame portion 154 is formed by the first plate-like portion 154A, the second plate-like portion 154B, a third plate-like portion 154C, and a fourth plate-like portion 154D (see FIGS. 3 to 5). The first plate-like portion 154A and the second plate-like portion 154B are parallel to each other. The third plate-like portion 154C and the fourth plate-like portion 154D are parallel to each other, and are each orthogonal to the first plate-like portion 154A and the second plate-like portion 154B. The frame portion 154 supports the opposite ends of the plurality of holding portions 152, and links the plurality of holding portions 152 to each other.

The plurality of belt-like portions 155 each extend in a wavy shape in the same direction (direction parallel to the longitudinal direction of the third plate-like portion 154C and the fourth plate-like portion 154D). Each belt-like portion 155 is disposed in a manner bridging between the first plate-like portion 154A and the second plate-like portion 154B, and orthogonally intersects with the holding portions 152 at respective locations where the holding holes 152A are formed.

The reinforcing frame 17 has a rectangular frame shape, and is fixed to the peripheral portion of the one surface 15A of the male-side holding member 15.

Next, a description will be given of an example of a method of manufacturing the male-side connector 10.

First, a metal thin film (not shown) is formed on one surface of a rectangular insulating film (not shown) which is a material of the male-side holding member 15 (thin film-forming step). Methods of forming the metal thin film include sputtering, vapor deposition, and plating.

After performing the thin film-forming step, the metal thin film is etched to form the plurality of connection portions 131 and the reinforcing member 17 (patterning step).

After performing the patterning step, the other surface of the insulating film is etched to form the plurality of holding holes 152A that reach the plurality of connection portions 131, respectively (holding hole-forming step).

After performing the holding hole-forming step, the linking portions 133 of the male-side contacts 13 are formed in the respective holding holes 152A such that the linking portions 133 fill in the holding holes 152A and are continuous with the connection portions 131. Then, the contact portion bodies 132A are formed on the linking portions 133, respectively, and further, the retaining portions 132B are formed on the contact portion bodies 132A, respectively (linking portion and contact portion-forming step). Methods of forming the linking portions 133, the contact portion bodies 132A, and the retaining portions 132B include a plating method, for example, in which an object having a predetermined shape is formed by superposing a plurality of plated layers.

After performing the linking portion and contact portion-forming step, the plurality of holes 151 are formed in the male-side insulating film at equally-spaced intervals in two directions orthogonal to each other by performing etching (hole forming step). As a result, the plurality of holding portions 152, the frame portion 154, and the plurality of belt-like portions 155 are formed in the insulating film.

By performing the above-described steps, the male-side connector 10 is manufactured.

To connect the connection portions 131 of the male-side contacts 13 to the terminal portions of the electronic component, a reflow soldering method, for example, is employed. Since the holes 151 are adjacent to the holding portions 152, after reflow soldering is performed, it is possible to visually check the state of connection between the connection portions 131 of the male-side connector 10 and the terminal portions of the electronic component from the other surface 15B side of the male-side holding member 15 through the holes 151.

Although the contact portion 132 of each male-side contact 13 includes the retaining portion 132B, the retaining portion 132B is not necessarily required to be formed, and the contact portion 132 may be formed into a cylindrical shape. The contact portion 132 may have any suitable shape insofar as it can be brought into contact with the contact portion 332, associated therewith, of the female-side connector 30.

Next, a description will be given of the female-side connector (connector) 30 according to a second embodiment of the present invention. The female-side connector 30 is a mating connector when viewed from the male-side connector 10. On the other hand, the male-side connector 10 is a mating connector when viewed from the female-side connector 30. As shown in FIGS. 10 to 13, the female-side connector 30 is comprised of the plurality of female-side contacts (contacts) 33, a female-side holding member (holding member) 35 that has a flat plate shape and holds the plurality of female-side contacts 33, and a reinforcing frame (reinforcing member) 37 that is fixed to the other surface 35B, opposite to one surface 35A, of the female-side holding member 35. The female-side connector 30 is mounted on a printed circuit board (object to be connected), not shown.

Each female-side contact 33 includes a connection portion 331, the contact portion 332, and a linking portion 334. The female-side contact 33 is formed of the same material as that of the male-side contact 13.

The connection portion 331 is disposed on the one surface 35A side of the female-side holding member 35 (see FIGS. 12 and 13), and is soldered to the printed circuit board. The connection portion 331 is continuous with the linking portion 334 in a direction of the thickness of the female-side holding member 35. The connection portion 331 has a flat plate shape, and slightly protrudes from the one surface 35A through a holding hole 352A, described hereinafter.

Figure 10:
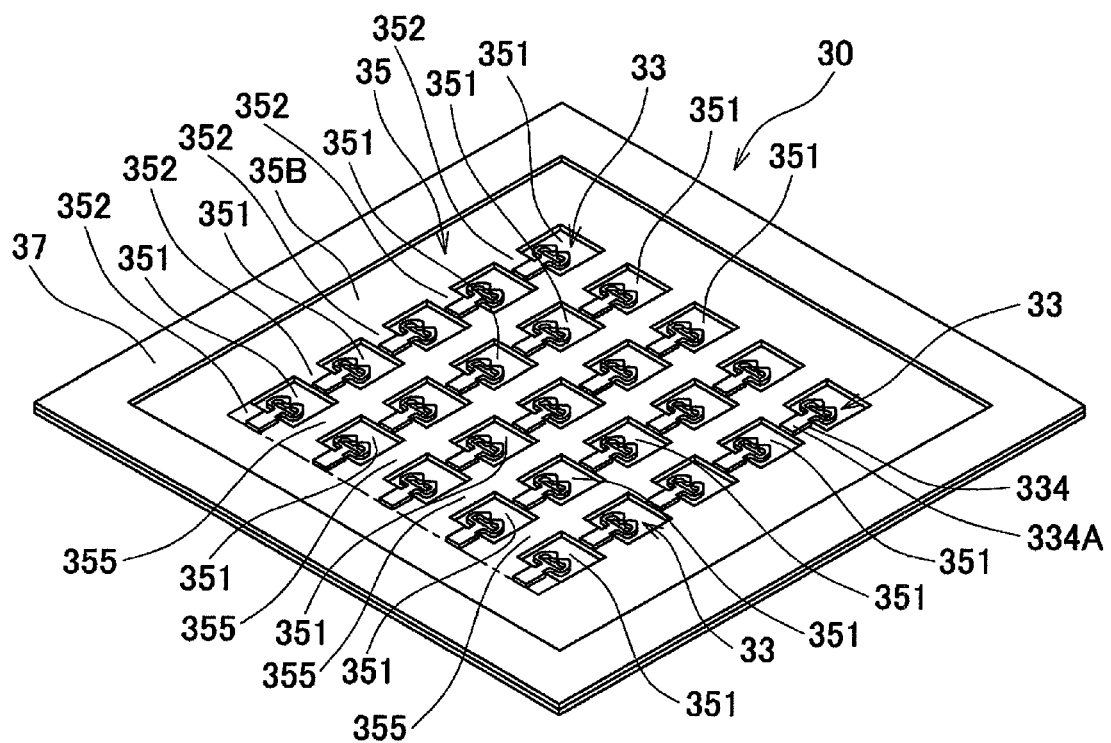
FIG. 10 is a perspective view of a female-side connector according to a second embodiment of the present invention, and this female-side connector is a mating connector of the male-side connector shown in FIG. 1.
Figure 11:
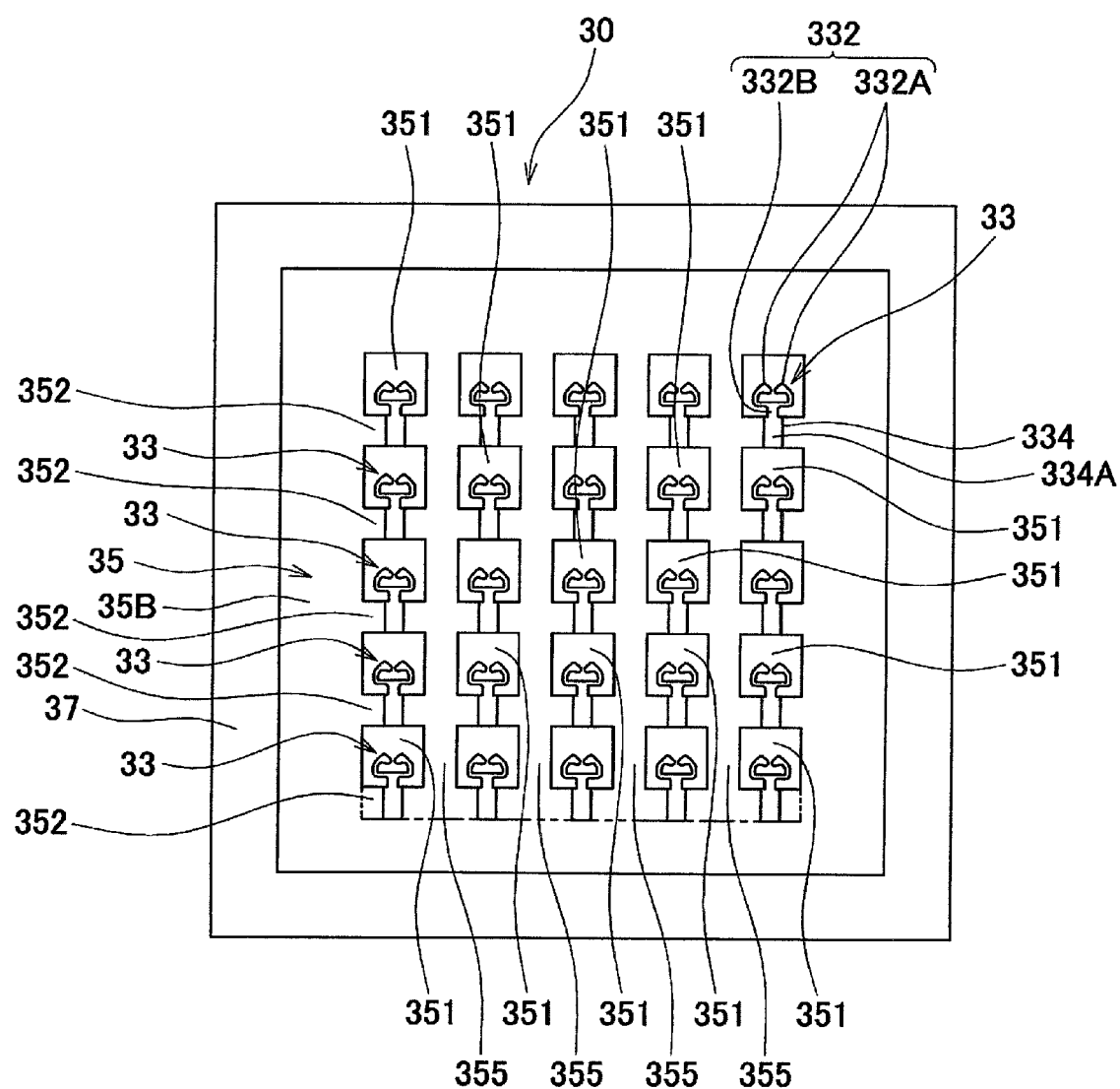
FIG. 11 is a plan view of the female-side connector shown in FIG. 10.

The contact portion 332 is disposed on the other surface 35B side of the female-side holding member 35 (see FIGS. 10 and 11). The contact portion 332 includes a pair of protruding portions 332A and an arm portion 332B. The contact portion 332 protrudes from one end of the linking portion 334 into a hole 351, described hereinafter. The contact portion 332 and the hole 351 are opposed to each other in the direction of the thickness of the female-side holding member 35. The pair of protruding portions 332A receive and sandwich the contact portion body 132A of the contact portion 132 of the male-side contact 13 associated therewith. Although the contact portion 332 of the female-side connector 30 is a mating contact portion when viewed from the male-side connector 10, the contact portion 132 of the male-side connector 10 is a mating contact portion when viewed from the female-side connector 30.

The linking portion 334 links the connection portion 331 and the contact portion 332. The linking portion 334 is held by a holding portion 352 of the female-side holding member 35. The linking portion 334 includes a linking portion body 334A and an embedded portion (not shown). The linking portion body 334A has a rectangular plate shape, and is disposed on the other surface 35B side of the female-side holding member 35 such that it is continuous with the arm portion 332B. The embedded portion is embedded in the holding hole 352A, described hereinafter, such that one end thereof is continuous with the linking portion body 334A and the other end thereof is continuous with the connection portion 331.

The female-side holding member 35 is formed of the same material as that of the male-side holding member 15. The female-side holding member 35 includes the plurality of holes (visually checking portions) 351, the plurality of holding portions 352, and a holding member-side linking portion 353.

Each hole 351 is a hole for receiving the contact portion 132, associated therewith, of the male-side connector 10. Note that after the female-side connector 30 is mounted on the printed circuit board, the state of connection between the connection portions 331 of the female-side contacts 33 and the terminal portions, not shown, arranged in a grid on the printed circuit board can be visually checked from the other surface 35B side of the female-side holding member 35 through the holes 351, and hence the holes 351 also function as the visually checking portions. The holes 351 are all adjacent to the holding portions 352.

The plurality of holding portions 352 each have a belt-like shape, and extend straight in the same direction (direction parallel to a longitudinal direction of a first plate-like portion 354A and a second plate-like portion 354B, described hereinafter). The holding portions 352 hold the linking portions 334 of the plurality of female-side contacts 33. Each holding portion 352 is formed with a plurality of holding holes 352A at equally-spaced intervals. Each holding hole 352A accommodates the embedded portion of the linking portion 334 of an associated one of the female-side contacts 33. The plurality of female-side contacts 33 held by the holding portions 352 are arranged in a grid.

Figure 12:
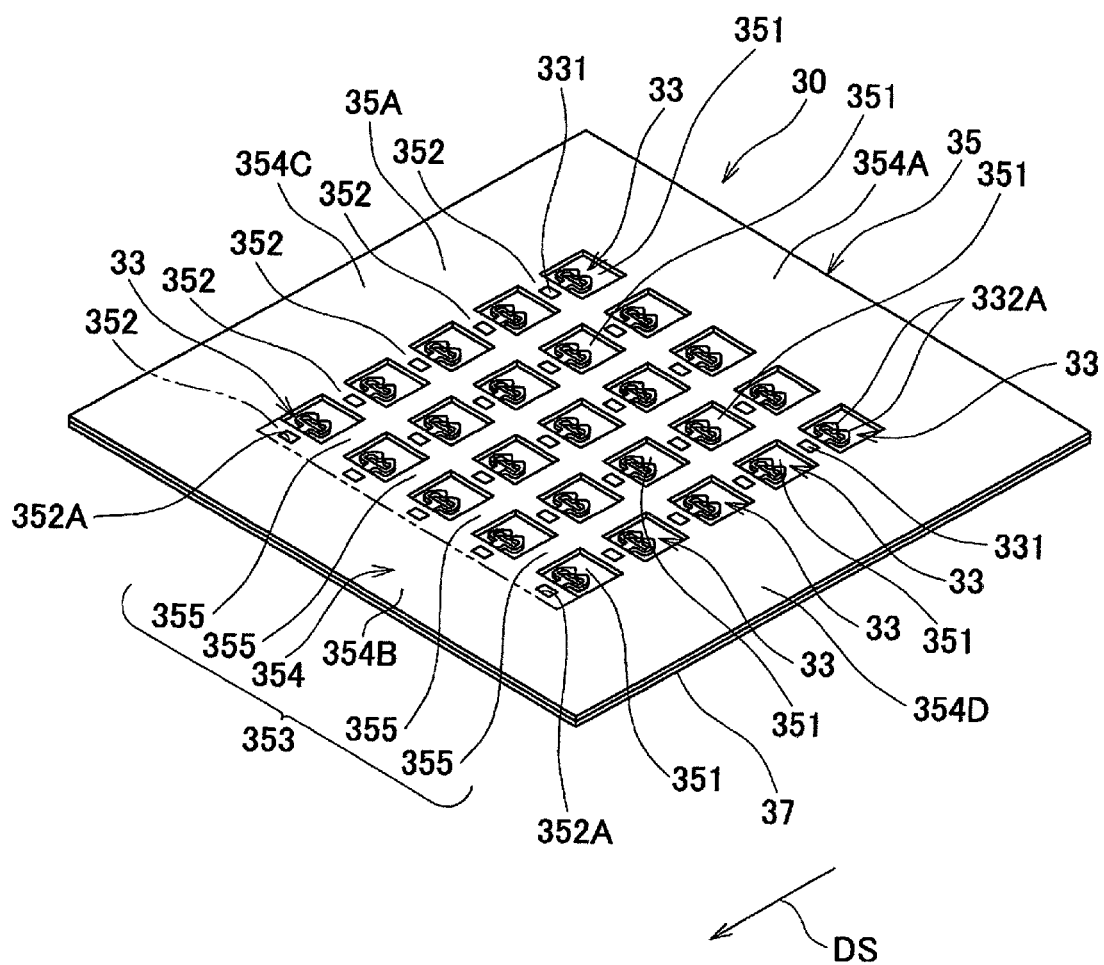
FIG. 12 is a perspective view of the female-side connector shown in FIG. 10, in which the female-side connector is inverted upside down.
Figure 13:
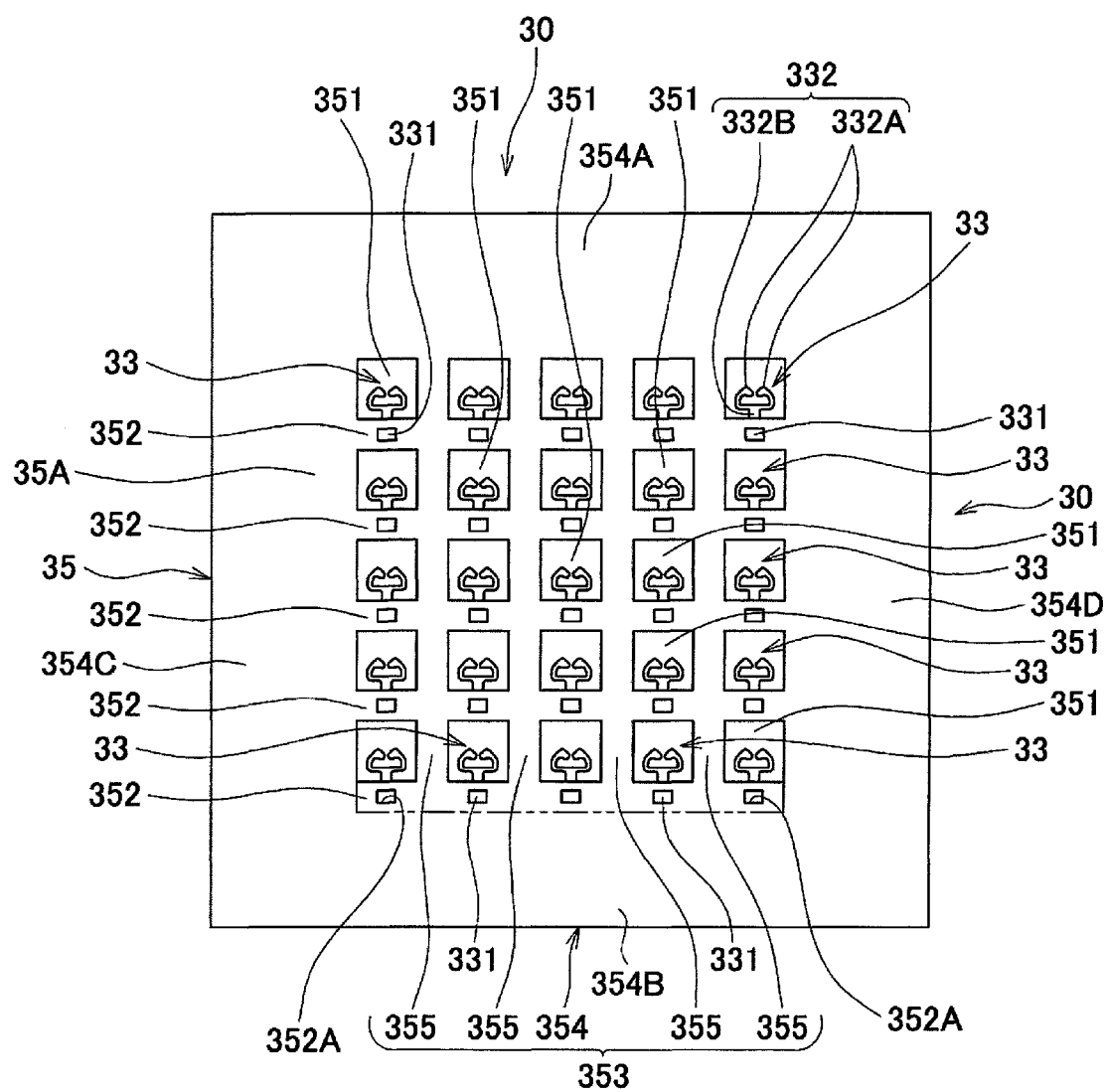
FIG. 13 is a bottom view of the female-side connector shown in FIG. 10.

In the female-side connector 30 according to the second embodiment, as indicated by a two-dot chain line in FIGS. 12 and 13, one of the holding portions 352 closest to the second plate-like portion 354B is integrally formed with the second plate-like portion 354B.

The holding member-side linking portion 353 is formed by a frame portion 354 and a plurality of belt-like portions 355.

The frame portion 354 is formed by the first plate-like portion 354A, the second plate-like portion 354B, a third plate-like portion 354C, and a fourth plate-like portion 354D (see FIGS. 12 and 13). The first plate-like portion 354A and the second plate-like portion 354B are parallel to each other. The third plate-like portion 354C and the fourth plate-like portion 354D are parallel to each other, and are each orthogonal to the first plate-like portion 354A and the second plate-like portion 354B. The frame portion 354 supports the opposite ends of the plurality of holding portions 352, and links the plurality of holding portions 352 to each other.

The plurality of belt-like portions 355 each have a belt-like shape, and extend straight in the same direction (direction parallel to a longitudinal direction of the third plate-like portion 354C and the fourth plate-like portion 354D). Each belt-like portion 355 is disposed in a manner bridging between the first plate-like portion 354A and the second plate-like portion 354B, and orthogonally intersects with the holding portions 352 at intermediate locations between two adjacent ones of the holding holes 352A of the holding portions 352.

The reinforcing frame 37 is fixed to a peripheral portion of the frame portion 354 of the one surface 35A of the female-side holding member 35.

The female-side connector 30 is manufactured by using the same method as that of the male-side connector 10, and hence description of the manufacturing method thereof is omitted.

To connect the connection portions 331 of the female-side contacts 33 to the printed circuit board, for example, the reflow soldering method is employed. Since the holes 351 are adjacent to the holding portions 352, it is possible to visually check the state of connection between the connection portions 331 and the terminal portions of the printed circuit board from the other surface 35B side of the female-side holding member 35 through the holes 351.

To connect the male-side connector 10 mounted on the electronic component and the female-side connector 30 mounted on the printed circuit board, first, the contact portions 132 of the male-side connector 10 are inserted in the holes 351 of the female-side connector 30 in the direction of the thickness of the female-side holding member 35 of the female-side connector 30.

Next, the male-side connector 10 is slid in the sliding direction DS (direction parallel to the longitudinal direction of the third plate-like portion 354C and the fourth plate-like portion 354D). As a result, the contact portion bodies 132A of the contact portions 132 of the male-side connector 10 are each sandwiched between an associated one of the pairs of protruding portions 332A of the contact portions 332 of the female-side connector 30, whereby the electronic component is electrically connected to the printed circuit board.

Although the contact portion 332 of each female-side contact 33 has the pair of protruding portions 332A, the contact portion 332 may have any suitable shape insofar as it can be brought into contact with the contact portion 132 of the male-side contact 13.

According to the male-side connector 10 of the first embodiment, it is possible to visually check the state of connection between the connection portions 131 of the male-side contacts 13 and the terminal portions of the electronic component from the other surface 15B side of the male-side holding member 15 through the holes 151, and hence it becomes unnecessary to use the X-ray nondestructive inspection system which is expensive and what is more requires a long inspection time. Therefore, when a manufacturer of a product in which the male-side connector 10 is used performs inspection on the product, inspection cost and inspection time are reduced.

Further, the holding portions 152 and the belt-like portions 155 each have a wavy shape and are extendable, and hence the male-side contacts 13 held by the holding portions 152 can be moved in the two directions orthogonal to each other (the two directions of a longitudinal direction of each holding portion 152 and a longitudinal direction of each belt-like portion 155). This reduces load generated on soldered junctures between the connection portions 131 of the male-side contacts 13 and the terminal portions of the electronic component due to a difference in thermal expansion coefficient between the male-side connector 10 and the electronic component, so that cracks are difficult to be generated in the solder.

Further, the reinforcing member 17 is fixed to the male-side holding member 15 so as to maintain a predetermined shape of the male-side holding member 15, and hence it is possible to suck the male-side connector 10 by using a suction nozzle (not shown) of an automatic mounter (not shown).

Note that the holding portions 152 and the belt-like portions 155 each have a wavy shape, and are extendable, and hence each male-side contact 13 is independently movable without being affected by the movement of other male-side contacts 13 in the vicinity thereof (independence). However, this independence is reduced if the reinforcing frame 17 has a high stiffness, which makes it difficult to reduce the load generated on the junctures between the connection portions 131 of the male-side contacts 13 and the terminal portions of the electronic component. In view of this, an adhesive tape (not shown) may be affixed to the male-side connector 10 in place of the reinforcing frame 17. The adhesive tape is removed after the male-side connector 10 is mounted on the electronic component. By using the adhesive tape, it is possible to improve the independence of each male-side contact 13 and also possible to suck the male-side connector 10 by using the suction nozzle of the automatic mounter.

Further, since the contact portion 132 of each male-side contacts 13 protrudes from the other surface 15B of the male-side holding member 15, and no contact pad is interposed between the other surface 15B of the male-side holding member 15 and the contact portion 132, it is possible to reduce the height of the male-side connector 10 by an amount corresponding to the contact pad.

Further, since no contact pad is provided on the other surface 15B of the male-side holding member 15, when soldering the connection portions 131 of the male-side contacts 13 to the terminal portions of the electronic component, it is possible to reduce the amount of soldering flowing to the other surface 15B side of the male-side holding member 15.

Further, according to the female-side connector 30 according to the second embodiment, it is possible to visually check the state of connection between the connection portions 331 of the female-side contacts 33 and the terminal portions of the printed circuit board from the other surface 35B side of the female-side holding member 35 through the holes 351. As a result, the female-side connector 30 can provide the same advantageous effects as provided by the male-side connector 10 according to the first embodiment.

Figure 14:
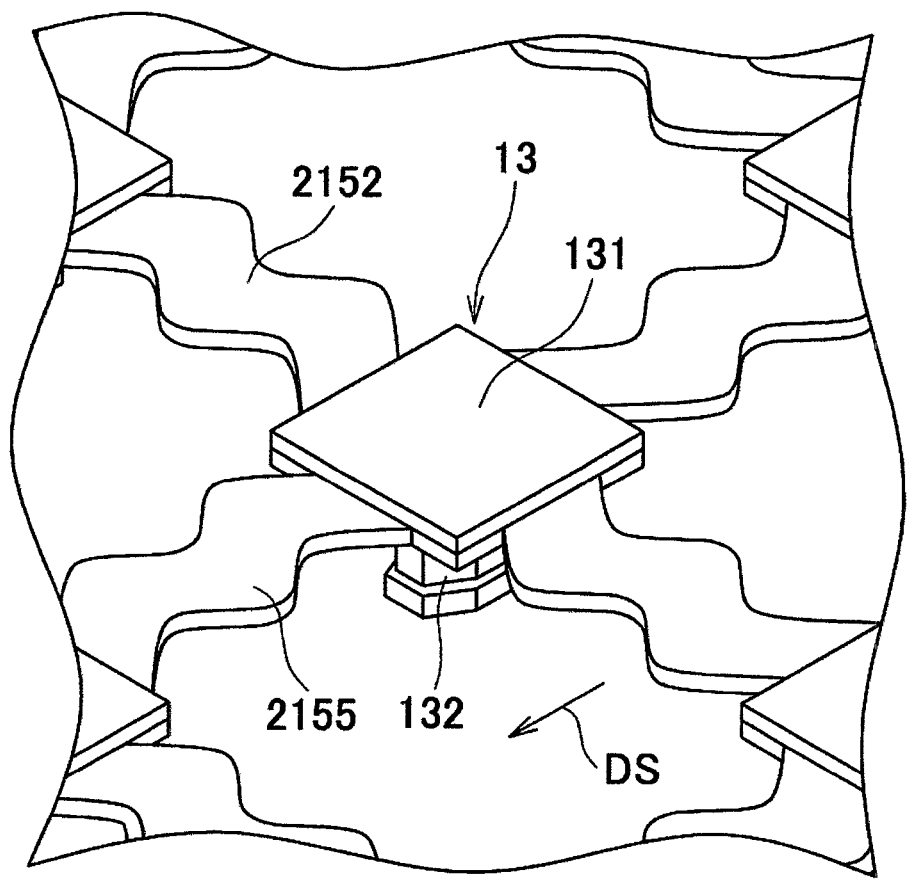
FIG. 14 is an enlarged perspective view of part of a first variation of the male-side connector shown in FIG. 1.
Figure 15:
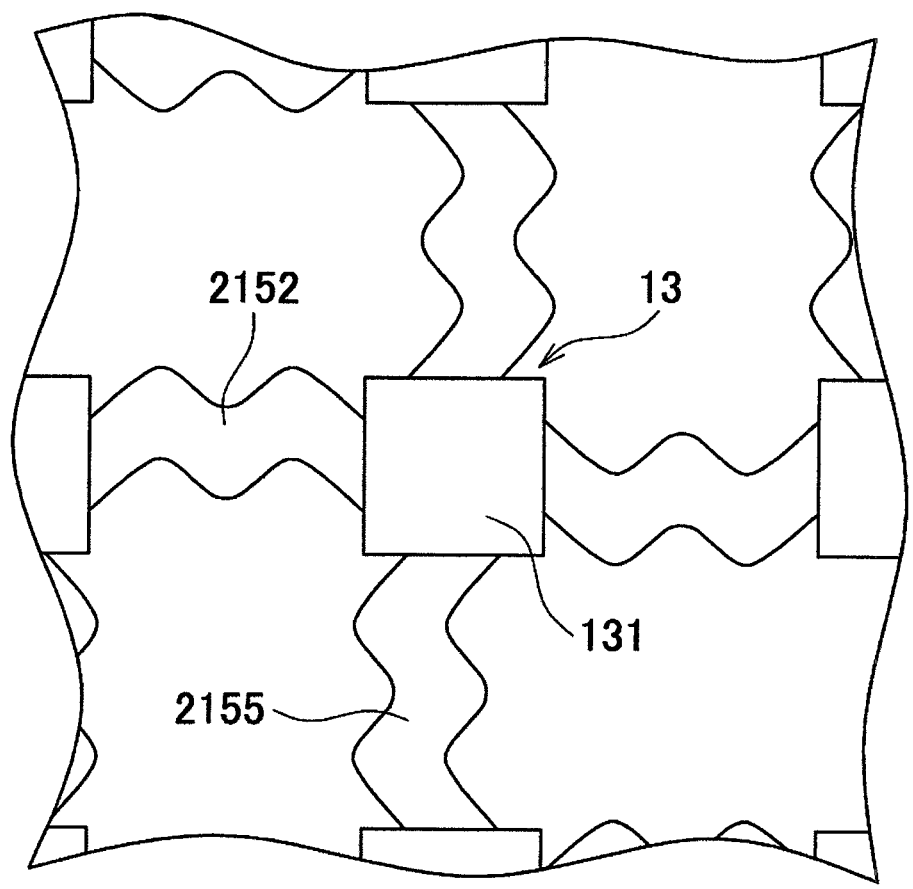
FIG. 15 is an enlarged plan view of the part of the first variation of the male-side connector shown in FIG. 1.

Next, a description will be given of a first variation of the first embodiment with reference to FIGS. 14 and 15.

The same component parts as those of the first embodiment are denoted by the same reference numerals, and detailed description thereof is omitted. Only main different components from those of the first embodiment will be described hereafter.

Each holding portion 152 and each belt-like portion 155 of the first embodiment both have a wavy shape, and each of holding portions 2152 and each of belt-like portions 2155 of the first variation both also have a wavy shape. On the other hand, the wave length of each wave of the wavy shape in the first variation is approximately half the wave length of each wave of the wavy shape in the first embodiment, but the number of waves of the wavy shape in the first variation is approximately double the number of waves of the wavy shape in the first embodiment.

According to the first variation of the first embodiment, it is possible to obtain the same advantageous effects as provided by the first embodiment, and further the holding portion 2152 and the belt-like portion 2155 between the two adjacent male-side contacts 13 are larger in length than those in the first embodiment so that a range within which each male-side contact 13 can be moved is increased.

Figure 16:
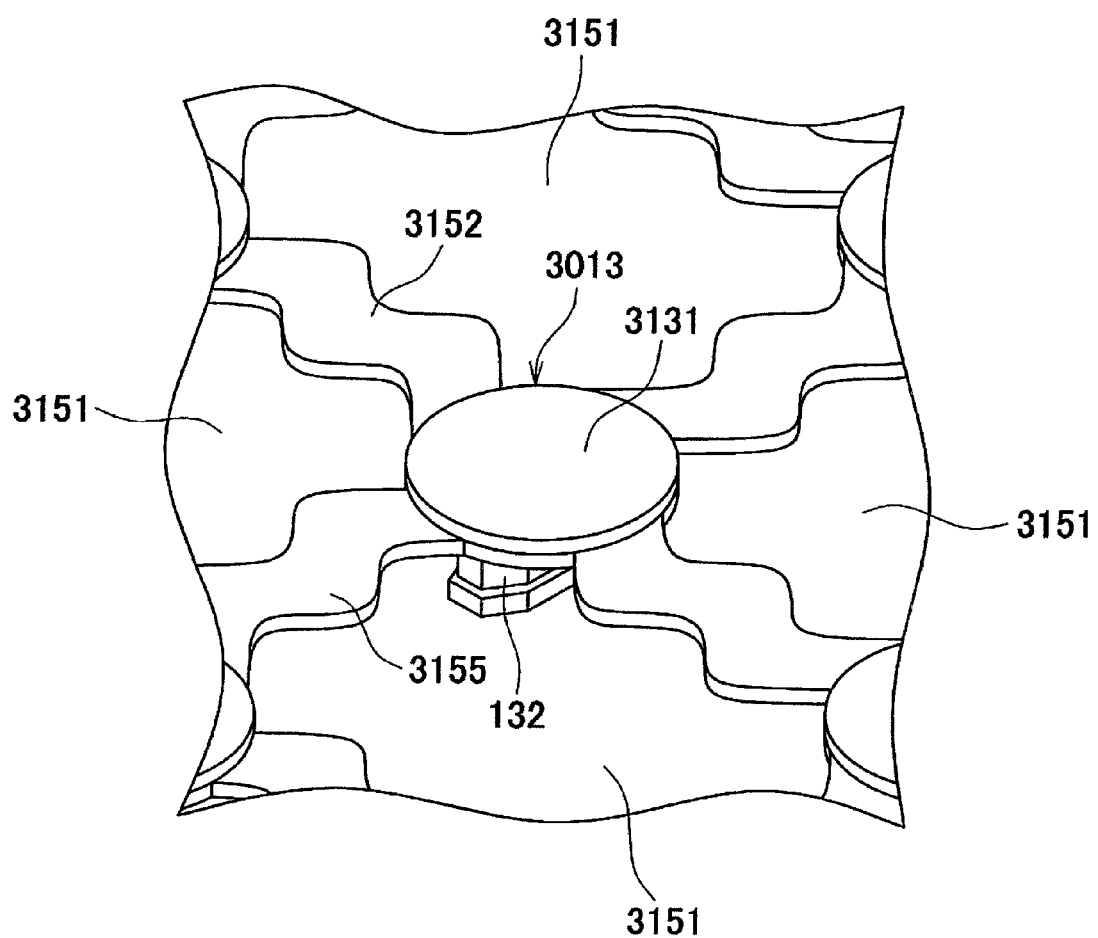
FIG. 16 is an enlarged perspective view of part of a second variation of the male-side connector shown in FIG. 1.
Figure 17:
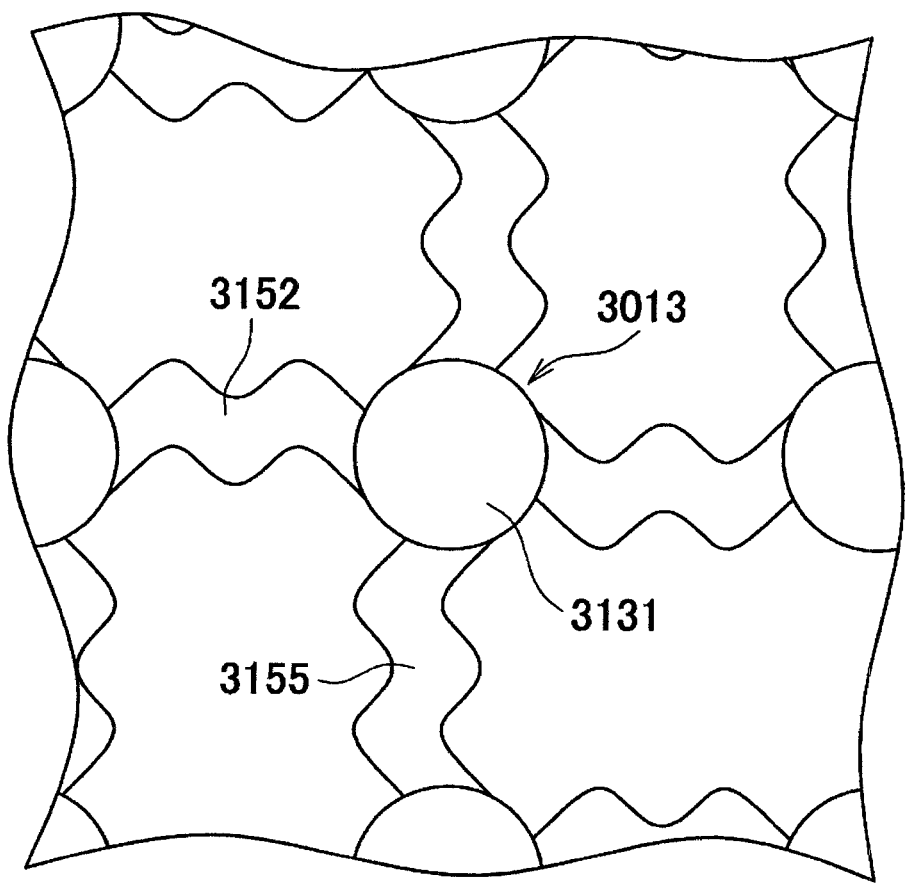
FIG. 17 is an enlarged plan view of the part of the second variation of the male-side connector shown in FIG. 1.

Next, a description will be given of a second variation of the first embodiment with reference to FIGS. 16 and 17.

The same component parts as those of the first embodiment are denoted by the same reference numerals, and detailed description thereof is omitted. Only main different components from those of the first embodiment will be described hereafter.

Each holding portion 152 and each belt-like portion 155 of the first embodiment both have a wavy shape, and each holding portion 3152 and each belt-like portion 3155 of the second variation both also have a wavy shape. On the other hand, similarly to the first variation shown in FIGS. 14 and 15, the wave length of each wave of the wavy shape in the second variation is approximately half the wave length of each wave of the wavy shape in the first embodiment, but the number of waves of the wavy shape in the second variation is approximately double the number of waves of the wavy shape in the first embodiment.

Further, although in the first embodiment and the first variation, the shape in plan view of each connection portion 131 of the male-side contact 13 is square, in the second variation, the shape in plan view of each connection portion 3131 of a male-side contact (contact) 3013 is circular. The diameter of the connection portion 3131 is substantially equal to the length of one side of the connection portion 131 of the male-side contact 13.

According to the second variation of the first embodiment, it is possible to obtain the same advantageous effects as provided by the first variation of the first embodiment. Further, the connection portion 3131 has a circular shape, which increases an opening area of a hole (visually checking portion) 3151, compared with the connection portion 131 having the square shape, and hence it is easy to visually check a juncture between the connection portion 3131 of the male-side contact 3013 and the terminal portion of the electronic component.

Figure 18:
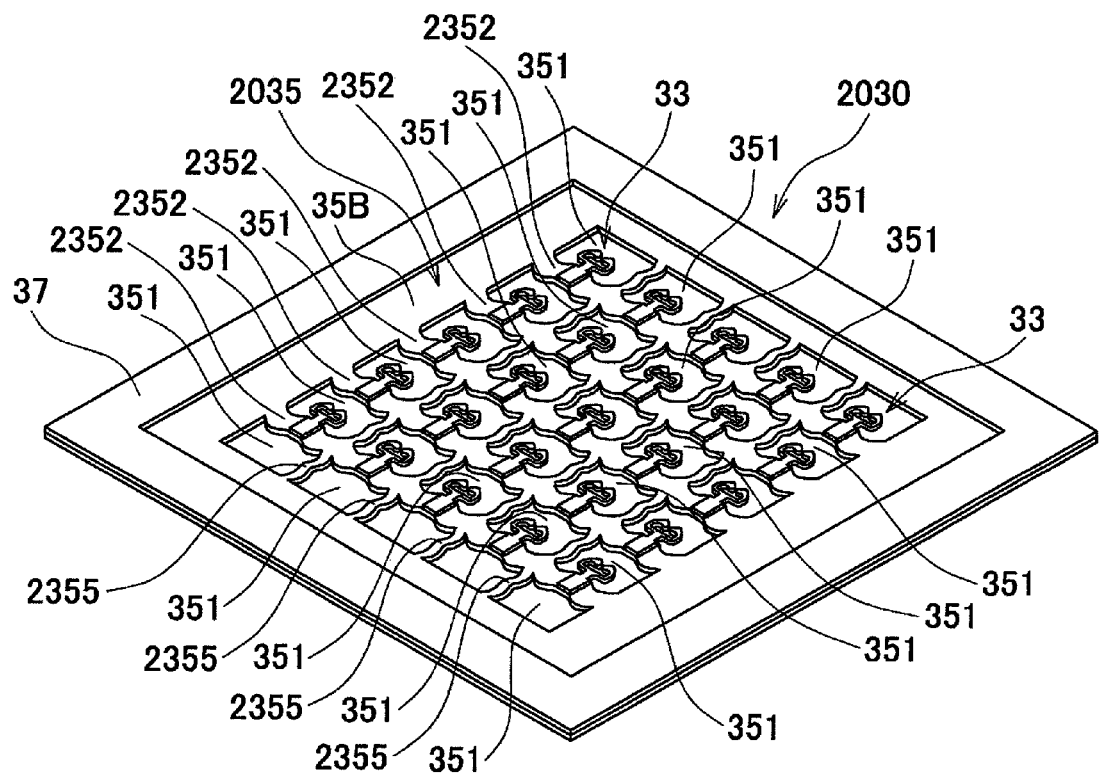
FIG. 18 is a perspective view of a first variation of the female-side connector shown in FIG. 10.
Figure 19:
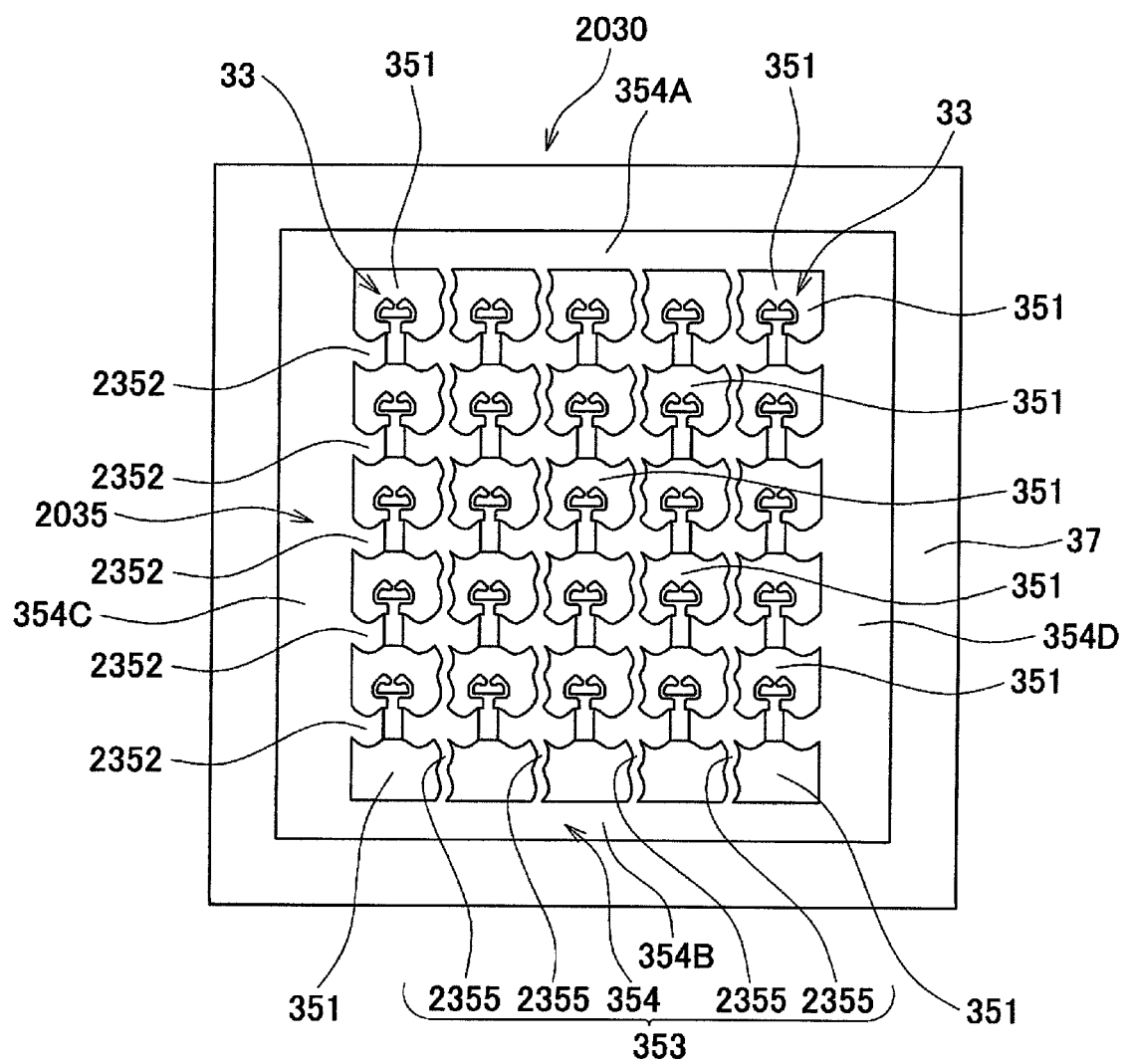
FIG. 19 is a plan view of the female-side connector shown in FIG. 18.

Next, a description will be given of a first variation of the second embodiment with reference to FIGS. 18 and 19.

The same components as those of the second embodiment are denoted by the same reference numerals, and detailed description thereof is omitted. Only main different components from those of the second embodiment will be described hereafter.

Although in the female-side connector 30 according to the second embodiment, each holding portion 352 is formed in a straight shape, in a female-side connector (connector) 2030 according to the first variation of the second embodiment, each holding portion 2352 and each belt-like portion 2355 of a female-side holding member (holding member) 2035 are both formed in a wavy shape.

Although in the female-side connector 30 according to the second embodiment, as indicated by two-dot chain lines in FIGS. 11 to 13, one of the holding portions 352 closest to the second plate-like portion 354B is integrally formed with the second plate-like portion 354B, in the female-side connector 2030 according to the first variation of the second embodiment, one of the holding portions 2352 closest to the second plate-like portion 354B is formed separately from the second plate-like portion 354B, and a plurality of holes (visually checking portions) 351 are formed therebetween.

According to the first variation of the second embodiment, it is possible to obtain the same advantageous effects as provided by the second embodiment, and since the holding portion 2352 and the belt-like portion 2355 of the female-side holding member 2035 are both formed in a wavy shape, each female-side contact 33 held by the holding portion 2352 can be independently moved. This reduces load generated on junctures between the connection portions 331 of the female-side contacts 33 and the terminal portions of the printed circuit board due to a difference in thermal expansion coefficient between the female-side connector 2030 and the printed circuit board.

Figure 20:
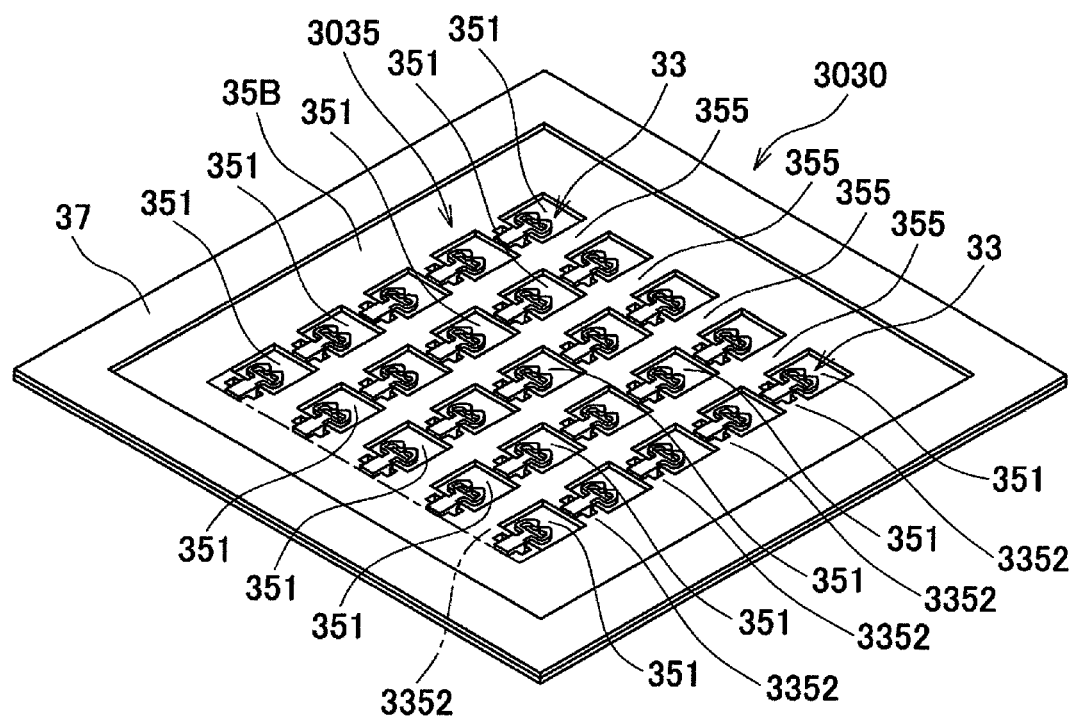
FIG. 20 is a perspective view of a second variation of the female-side connector shown in FIG. 10.
Figure 21:
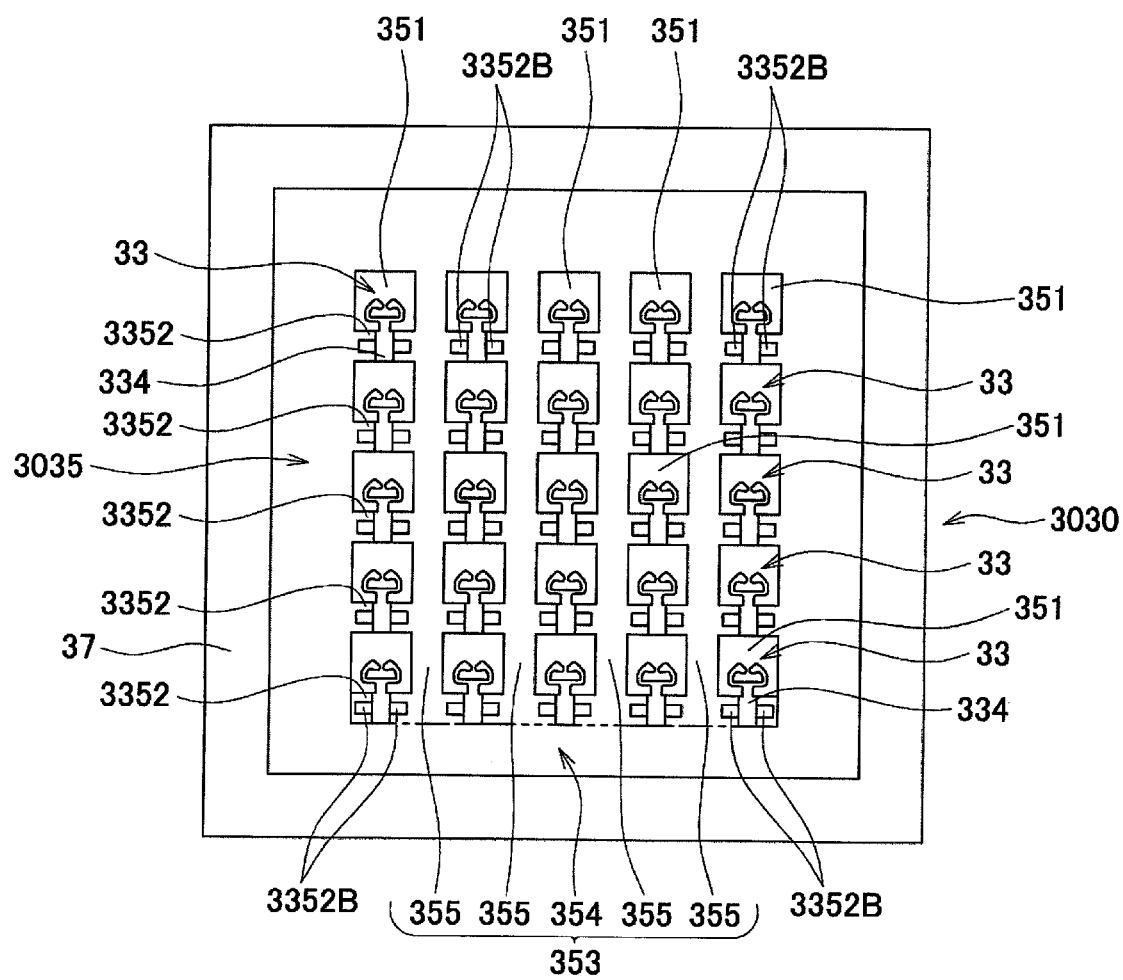
FIG. 21 is a plan view of the female-side connector shown in FIG. 20.
Figure 22:
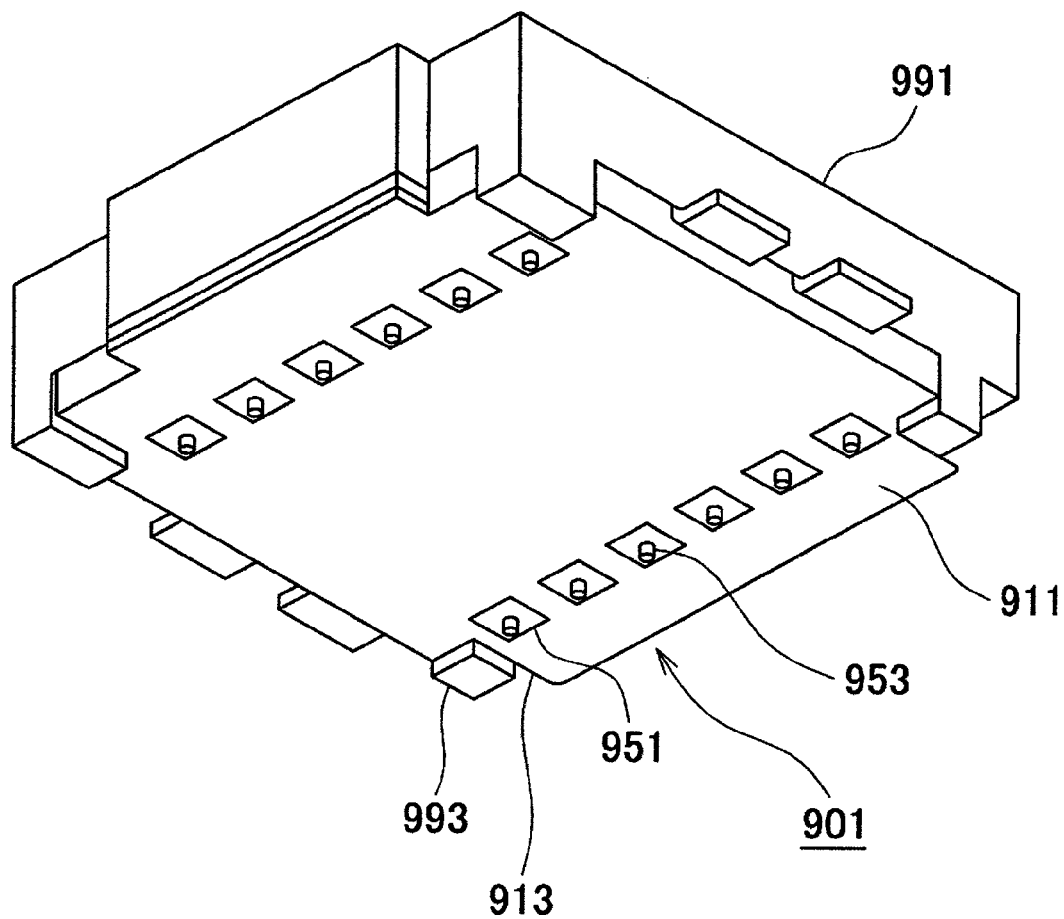
FIG. 22 is a perspective view of a module on which a conventional male connector has been mounted.
Figure 23:
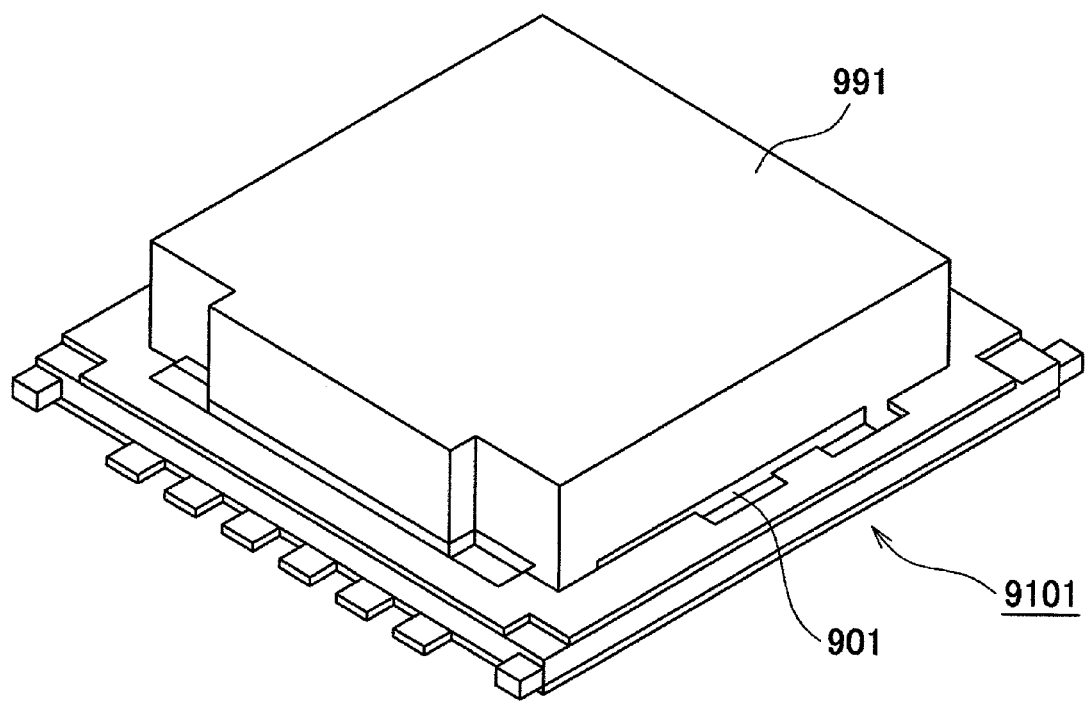
FIG. 23 is a perspective view showing a state in which the male connector mounted on the module is fitted to a female connector.

Next, a description will be given of a second variation of the second embodiment with reference to FIGS. 20 and 21.

The same components as those of the second embodiment are denoted by the same reference numerals, and detailed description thereof is omitted. Only main different components from those of the second embodiment will be described hereafter.

In a female-side connector (connector) 3030 according to the second variation of the second embodiment, each holding portion 3352 of a female-side holding member (holding member) 3035 is formed with a plurality of pairs of holes (flexibility-increasing holes) 3352B in a manner adjacent to opposite sides of the linking portion 334 of each female-side contact 33.

According to the second variation of the second embodiment, it is possible to obtain the same advantageous effects as provided by the second embodiment, and further it is possible to visually check the state of connection between the connection portions 331 of the female-side contacts 33 and the terminal portions of the printed circuit board also through the holes 3352B formed in the holding portions 3352. Therefore, it can be said that the holes 3352B also have the same function as the visually checking portions. Further, the holes 3352B formed in each holding portion 3352 make the holding portion 3352 more flexible, and hence this reduces load generated on the junctures between the connection portions 331 of the female-side contacts 33 and the terminal portions of the printed circuit board due to a difference in thermal expansion coefficient between the female-side connector 3030 and the printed circuit board.

Although in the above-described first embodiment (FIGS. 1 to 9), the holding member-side linking portion 153 is formed by the frame portion 154 and the belt-like portions 155, the holding member-side linking portion 153 may be formed only by the frame portion 154, or may be formed only by the belt-like portions 155. When the holding member-side linking portion 153 is formed only by the belt-like portions 155, the male-side holding member is formed in a net-like shape (not shown). In this case, the visually checking portions are formed by the plurality of holes 151 or 351 and a plurality of cutouts (not shown) which are arranged in a manner surrounding the holes.

Similarly, although in the above-described second embodiment (FIGS. 10 to 13), the holding member-side linking portion 353 is formed by the frame portion 354 and the belt-like portions 355, the holding member-side linking portion 353 may be formed only by the frame portion 354, or may be formed only by the belt-like portions 355. When the holding member-side linking portion 353 is formed only by the belt-like portions 355, the female-side holding member is formed in a net-like shape (not shown). In this case, the visually checking portions are formed by the plurality of holes 351 and a plurality of cutouts (not shown) which are arranged in a manner surrounding the holes.

Note that in the second variation of the second embodiment (FIGS. 20 and 21), the pair of holes 3352B may be formed in the holding portion 3352 in a manner spaced from the linking portion 334 of each female-side contact 33.

Further, although in the above-described embodiments and variations, the reinforcing frames 17 and 37 having a rectangular shape are employed as the reinforcing member, the shape of the reinforcing member is not limited to the rectangular frame.

Although in the above-described embodiments and variations, each of the male-side holding member 15, and the female-side holding members 35, 2035, and 3035, as the holding member, is formed by an insulating film having elasticity, the holding member is not required to have elasticity.

Further, although in the above-described embodiments and variations, the reinforcing frame 17 as the reinforcing member is fixed to the one surface 15A of the male-side holding member 15, the reinforcing frame 17 may be fixed to the other surface 15B of the male-side holding member 15, or may be fixed to both of the one surface 15A and the other surface 15B of the male-side holding member 15. Similarly, although the reinforcing frame 37 is fixed to the other surface 35B of the female-side holding members 35, 2035, and 3035, the reinforcing frame 37 may be fixed to the one surface 35A of the female-side holding members 35, 2035, and 3035, or may be fixed to both of the one surface 35A and the other surface 35B of the female-side holding members 35, 2035, and 3035.

Further, although in the above-described embodiments and variations, each of the holding portions 152, 2152, 3152, 352, 2352, and 3352, and each associated one of the belt-like portions associated therewith 155, 2155, 3155, 355, and 2355 are formed in the same shape, i.e. are both formed in a wavy shape or a straight shape, one of each of the holding portions 152, 2152, 3152, 352, 2352, and 3352, and each associated one of the belt-like portions 155, 2155, 3155, 355, and 2355 may be formed in a wavy shape, and the other of the same may be formed in a straight shape.

Although the above-described embodiments and variations employ the structure in which the contact portions 132 of the male-side connector 10 are inserted in the holes 351 of the female-side connector 30 in the direction of the thickness of the female-side holding member 35, 2035, or 3035 of the female-side connector 30, and then the male-side connector 10 is slid in the sliding direction DS to thereby connect the contact portions 132 of the male-side connector 10 to the contact portions 332 of the female-side connector 30, in place of this structure, a structure may be employed in which only by bringing the contact portions 132 of the male-side connector 10 into contact with the contact portions 332 of the female-side connector 30 in the direction of the thickness of the female-side holding member 35, 2035, or 3035 of the female-side connector 30, the contact portions 132 of the male-side connector 10 are connected to the contact portions 332 of the female-side connector 30.

It is further understood by those skilled in the art that the foregoing are the preferred embodiments of the present invention, and that various changes and modification may be made thereto without departing from the spirit and scope thereof.

What is claimed is:

1. A connector that is connected to a mating connector, including:
   a plurality of contacts, and
   a holding member that has a flat plate shape and holds the plurality of contacts,
   wherein each contact comprises:
   a connection portion that is disposed on one surface side of the holding member and is connected to an object to be connected;
   a contact portion that is disposed on the other surface side of the holding member and is brought into contact with a mating contact portion of the mating connector; and
   a linking portion that links between the connection portion and the contact portion, and
   wherein the holding member comprises:
   a plurality of holding portions that each have a belt-like shape and hold a plurality of the linking portions;
   a holding member-side linking portion that links the plurality of holding portions that are arranged in parallel to each other; and
   a plurality of visually checking portions for visually checking a state of connection between the connection portions and terminal portions of the object to be connected, from the other surface side of the holding member, and
   wherein the visually checking portions are adjacent to the holding portions.

2. The connector according to claim 1, wherein the connection portions are arranged in a manner corresponding to a grid array of the terminal portions of the object to be connected, and wherein the connection portions are continuous with the linking portions in a direction of a thickness of the holding member.

3. The connector according to claim 1, wherein the holding member-side linking portion includes:
   a frame portion that supports opposite ends of the plurality of holding portions, and
   a plurality of belt-like portions that are arranged in a manner bridging the frame portion such that the belt-like portions each intersect with the plurality of holding portions, and
   wherein the visually checking portions are holes.

4. The connector according to claim 2, wherein the holding member-side linking portion includes:
   a frame portion that supports opposite ends of the plurality of holding portions, and
   a plurality of belt-like portions that are arranged in a manner bridging the frame portion such that the belt-like portions each intersect with the plurality of holding portions, and
   wherein the visually checking portions are holes.

5. The connector according to claim 3, wherein the holding member has elasticity, and
   wherein at least one of each holding portion and each belt-like portion has a wavy shape.

6. The connector according to claim 4, wherein the holding member has elasticity, and
   wherein at least one of each holding portion and each belt-like portion has a wavy shape.

7. The connector according to claim 3, wherein the holding member has elasticity, and
   wherein at least one of each holding portion and each belt-like portion has a straight shape.

8. The connector according to claim 4, wherein the holding member has elasticity, and
   wherein at least one of each holding portion and each belt-like portion has a straight shape.

9. The connector according to claim 7, wherein a pair of flexibility-increasing holes are formed in the holding portion in a manner adjacent to opposite sides of the linking portion.

10. The connector according to claim 8, wherein a pair of flexibility-increasing holes are formed in the holding portion in a manner adjacent to opposite sides of the linking portion.

11. The connector according to claim 1, wherein the connection portion has a flat plate shape.

12. The connector according to claim 2, wherein the connection portion has a flat plate shape.

13. The connector according to claim 1, wherein the contact portion protrudes from the other surface of the holding member perpendicularly thereto and has a shape that is inserted into the mating contact portion.

14. The connector according to claim 2, wherein the contact portion protrudes from the other surface of the holding member perpendicularly thereto and has a shape that is inserted into the mating contact portion.

15. The connector according to claim 1, further comprising a reinforcing member that is fixed to a peripheral portion of at least one surface of the holding member.

16. The connector according to claim 2, further comprising a reinforcing member that is fixed to a peripheral portion of at least one surface of the holding member.

17. The connector according to claim 1, wherein the object to be connected is an electronic component.

18. The connector according to claim 2, wherein the object to be connected is an electronic component.

19. The connector according to claim 1, wherein the object to be connected is a printed circuit board.

20. The connector according to claim 2, wherein the object to be connected is a printed circuit board.

* * * * *